(12) United States Patent
Yamazaki

(10) Patent No.: US 10,475,931 B2
(45) Date of Patent: *Nov. 12, 2019

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/791,991

(22) Filed: Oct. 24, 2017

(65) Prior Publication Data

US 2018/0122950 A1 May 3, 2018

(30) Foreign Application Priority Data

Nov. 1, 2016 (JP) .................... 2016-214724

(51) Int. Cl.
*H01L 29/786* (2006.01)
*H01L 29/66* (2006.01)
(Continued)

(52) U.S. Cl.
CPC ...... *H01L 29/7869* (2013.01); *H01L 21/0228* (2013.01); *H01L 21/02178* (2013.01);
(Continued)

(58) Field of Classification Search
CPC ............ H01L 29/7869; H01L 29/4983; H01L 29/66969; H01L 21/02178; H01L 21/02181; H01L 21/02274; H01L 21/0228; H01L 21/385; H01L 21/443; H01L 21/47573; H01L 27/1207
(Continued)

(56) References Cited

U.S. PATENT DOCUMENTS 6,876,021 B2 4/2005 Martinj et al.
6,924,227 B2 8/2005 Minamihaba et al.
(Continued)

FOREIGN PATENT DOCUMENTS

JP 2007-096055 A 4/2007
JP 2007-123861 A 5/2007
JP 2011-119674 A 6/2011

*Primary Examiner* — Tong-Ho Kim
(74) *Attorney, Agent, or Firm* — Fish & Richardson P.C.

(57) ABSTRACT

A semiconductor device that can be miniaturized or highly integrated is provided. The semiconductor device includes a first insulator over a substrate; a first oxide over the first insulator; a second oxide in contact with at least a portion of the top surface of the first oxide; a second insulator over the second oxide; a first conductor over the second insulator; a second conductor over the first conductor; a third insulator over the second conductor; a fourth insulator in contact with side surfaces of the second insulator, the first conductor, the second conductor, and the third insulator; and a fifth insulator in contact with the top surface of the second oxide and a side surface of the fourth insulator. The top surface of the fourth insulator is substantially aligned with the top surface of the third insulator.

12 Claims, 25 Drawing Sheets

(51) Int. Cl.
  *H01L 21/02* (2006.01)
  *H01L 21/4757* (2006.01)
  *H01L 27/12* (2006.01)
  *H01L 29/49* (2006.01)
  *H01L 21/443* (2006.01)
  *H01L 21/385* (2006.01)

(52) U.S. Cl.
  CPC .. *H01L 21/02181* (2013.01); *H01L 21/02274* (2013.01); *H01L 21/385* (2013.01); *H01L 21/443* (2013.01); *H01L 21/47573* (2013.01); *H01L 27/1207* (2013.01); *H01L 29/4983* (2013.01); *H01L 29/66969* (2013.01)

(58) Field of Classification Search
  USPC .......................................................... 257/43
  See application file for complete search history.

(56) References Cited

U.S. PATENT DOCUMENTS

| | | |
|---|---|---|
| 7,598,557 B2 | 10/2009 | Nagai et al. |
| 8,062,978 B2 | 11/2011 | Choi et al. |
| 8,228,514 B2 | 7/2012 | Yokoyama |
| 8,421,081 B2 | 4/2013 | Kato et al. |
| 8,441,101 B2 | 5/2013 | Wang |
| 8,852,961 B2 | 10/2014 | Wang |
| 8,860,108 B2 | 10/2014 | Yamazaki et al. |
| 8,877,624 B2 | 11/2014 | Hull et al. |
| 8,981,370 B2 | 3/2015 | Tanaka et al. |
| 8,995,174 B2 | 3/2015 | Koyama |
| 9,048,265 B2 | 6/2015 | Hondo et al. |
| 9,099,560 B2 | 8/2015 | Yamazaki |
| 9,318,618 B2 | 4/2016 | Endo et al. |
| 9,666,698 B2 | 5/2017 | Yamazaki |
| 2006/0281210 A1 | 12/2006 | Kiuchi et al. |
| 2008/0073685 A1 | 3/2008 | Wang |
| 2012/0032730 A1 | 2/2012 | Koyama |
| 2012/0276694 A1 | 11/2012 | Koezuka et al. |
| 2012/0313152 A1 | 12/2012 | Yokoi et al. |
| 2013/0075735 A1 | 3/2013 | Watanabe et al. |
| 2013/0187161 A1* | 7/2013 | Yamazaki ............. H01L 29/786 257/57 |
| 2013/0228774 A1 | 9/2013 | Okazaki et al. |
| 2013/0234131 A1 | 9/2013 | Tanaka et al. |
| 2013/0270563 A1 | 10/2013 | Yamazaki |
| 2014/0042434 A1 | 2/2014 | Yamazaki |
| 2016/0035865 A1 | 2/2016 | Nagamatsu et al. |
| 2016/0260835 A1* | 9/2016 | Yamazaki ........... H01L 29/7869 |
| 2016/0276488 A1 | 9/2016 | Yamazaki |
| 2016/0284856 A1* | 9/2016 | Shimomura ........ H01L 29/7869 |

* cited by examiner

FIG. 11A
FIG. 11C
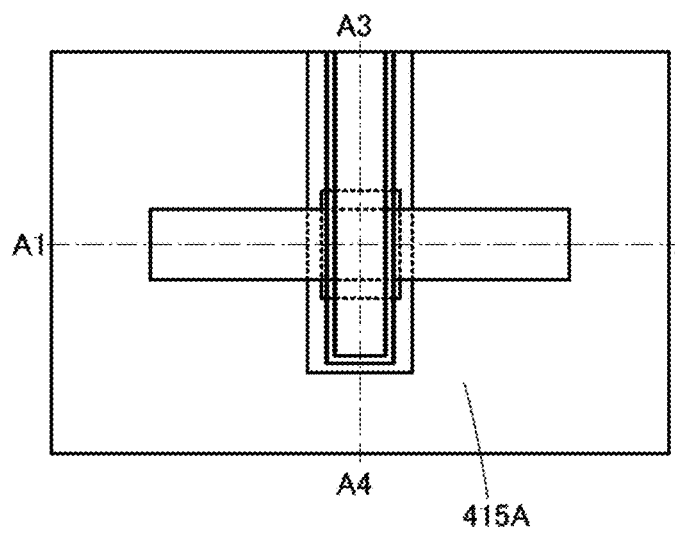
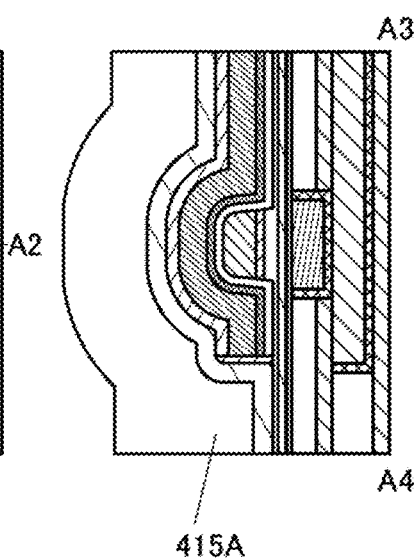
FIG. 11B
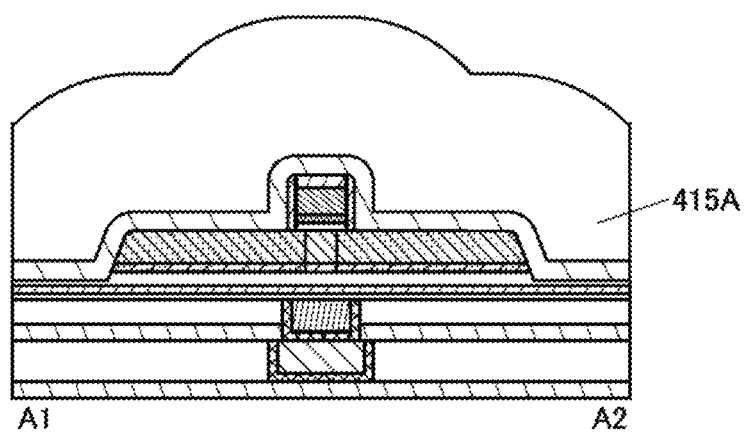

FIG. 12A
FIG. 12C
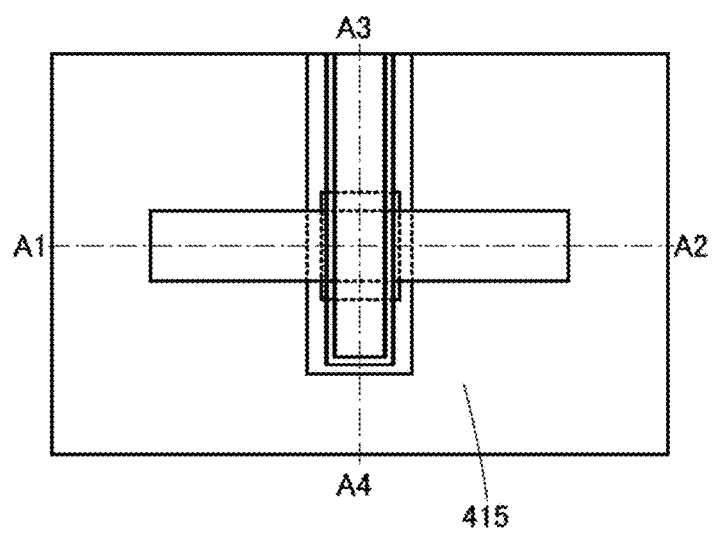
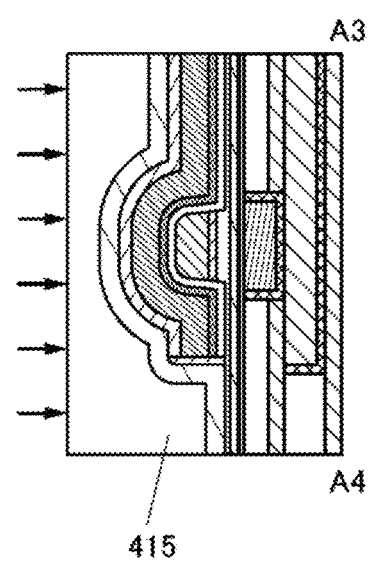
FIG. 12B
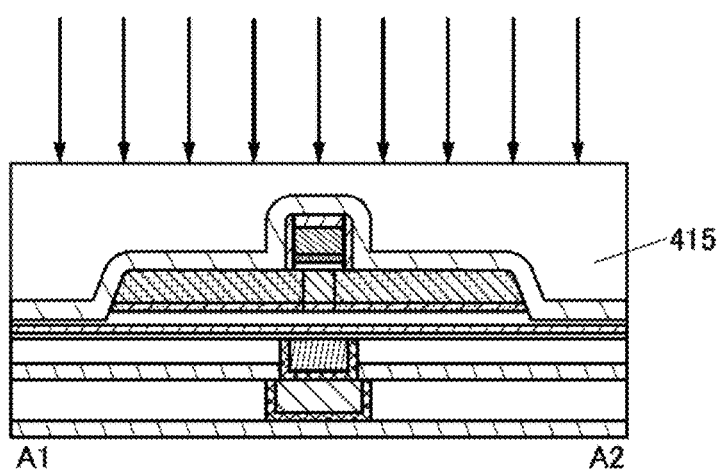

SEMICONDUCTOR DEVICE AND MANUFACTURING METHOD THEREOF

BACKGROUND OF THE INVENTION

1. Field of the Invention

One embodiment of the present invention relates to a semiconductor device and a manufacturing method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

2. Description of the Related Art

A technique of fabricating a transistor using a semiconductor thin film has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor. As another material, an oxide semiconductor has been attracting attention.

Techniques have been disclosed by each of which a display device is manufactured using a transistor whose active layer is formed of zinc oxide or an In—Ga—Zn-based oxide as an oxide semiconductor (see Patent Documents 1 and 2), for example.

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119674

SUMMARY OF THE INVENTION

The integration of integrated circuits and miniaturization of transistors have progressed in accordance with an increase in performance and a reduction in size and weight of electronic devices. Thus, the process rule for fabricating a transistor has decreased year by year to 45 nm, 32 nm, and then 22 nm. Accordingly, transistors with fine structures including oxide semiconductors are required to have good electrical characteristics as designed.

An object of one embodiment of the present invention is to provide a semiconductor device that can be miniaturized or highly integrated. Another object of one embodiment of the present invention is to provide a semiconductor device having good electrical characteristics. Another object of one embodiment of the present invention is to provide a semiconductor device with low off-state current. Another object of one embodiment of the present invention is to provide a transistor with high on-state current. Another object of one embodiment of the present invention is to provide a highly reliable semiconductor device. Another object of one embodiment of the present invention is to provide a semiconductor device with low power consumption. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the description of these objects does not preclude the existence of other objects. In one embodiment of the present invention, there is no need to achieve all the objects. Other objects will be apparent from and can be derived from the description of the specification, the drawings, the claims, and the like.

One embodiment of the present invention is a transistor including an oxide semiconductor. An insulator is provided in contact with side surfaces of a gate electrode and a gate insulating film. The insulator is preferably deposited by an atomic layer deposition (ALD) method. When the ALD method is employed for the deposition, an insulator formed of a film with good coverage or a dense film can be obtained. The provision of such an insulator in contact with the side surface of the gate insulating film can prevent outward diffusion of oxygen contained in the gate insulating film and entry of impurities such as water or hydrogen into the gate insulating film.

In addition, even if the transistor is a miniaturized transistor, the provision of the insulator can prevent source and drain regions from extending under the gate more than necessary at the time when the source and drain regions of the transistor are formed, so that the transistor can have good electrical characteristics.

One embodiment of the present invention is a semiconductor device including a first insulator over a substrate; a first oxide over the first insulator; a second oxide in contact with at least a portion of a top surface of the first oxide; a second insulator over the second oxide; a first conductor over the second insulator; a second conductor over the first conductor; a third insulator over the second conductor; a fourth insulator in contact with side surfaces of the second insulator, the first conductor, the second conductor, and the third insulator; and a fifth insulator in contact with a top surface of the second oxide and a side surface of the fourth insulator. It is preferable that a top surface of the fourth insulator be substantially aligned with a top surface of the third insulator.

In the above semiconductor device, it is preferable that the first oxide and the second oxide each include In, an element M (M is Al, Ga, Y, or Sn), and Zn.

In the above semiconductor device, it is preferable that the first oxide include a first region not overlapping with the fourth insulator and the second conductor and a second region overlapping with the fourth insulator and the second conductor, and an atomic ratio of In to the element M be greater in the first region than in the second region.

In the above semiconductor device, the second oxide may include at least a third region in contact with the fifth insulator and a fourth region overlapping with the second insulator, and a concentration of at least one of hydrogen and nitrogen may be higher in the third region than in the fourth region. Furthermore, in the above semiconductor device, the third region may include a portion overlapping with the fourth insulator and the second insulator.

In the above semiconductor device, it is preferable that the fourth insulator include aluminum oxide or hafnium oxide. Furthermore, in the above semiconductor device, it is preferable that the third insulator include aluminum oxide or hafnium oxide. Furthermore, in the above semiconductor device, it is preferable that a thickness of the third insulator be greater than a thickness of the fourth insulator.

In the above semiconductor device, it is preferable that the first conductor include a conductive oxide. Furthermore, in the above semiconductor device, it is preferable that the fifth insulator include either one or both of hydrogen and nitrogen. Furthermore, in the above semiconductor device, it is preferable that the fifth insulator be in contact with a side surface of the first oxide and a side surface of the second oxide.

It is preferable that the above semiconductor device further include a third conductor and a fourth conductor that is placed to face the third conductor, with the first conductor and the second conductor positioned between the third conductor and the fourth conductor, the third conductor be in contact with a top surface and a first side surface of the second oxide through a first opening in the fifth insulator, and the fourth conductor be in contact with the top surface and a second side surface of the second oxide through a second opening in the fifth insulator. Furthermore, it is preferable that the above semiconductor device further include a fifth conductor below the first insulator, and the fifth conductor be placed to include a region overlapping with the second oxide, the first conductor, and the second conductor.

Another embodiment of the present invention is a method for manufacturing a semiconductor device, including the steps of depositing a first insulator over a substrate; depositing a first oxide film and a second oxide film in this order over the first insulator; processing the first oxide film and the second oxide film into island shapes to form a first oxide and a second oxide; depositing a first insulating film, a first conductive film, a second conductive film, and a second insulating film in this order over the second oxide; etching the first insulating film, the first conductive film, the second conductive film, and the second insulating film to form a second insulator, a first conductor, a second conductor, and a third insulator; depositing a third insulating film by an ALD method to cover the first insulator, the first oxide, the second oxide, the second insulator, the first conductor, the second conductor, and the third insulator; subjecting the third insulating film to a dry etching treatment to form a fourth insulator in contact with side surfaces of the second insulator, the first conductor, the second conductor, and the third insulator; depositing a fifth insulator by a PECVD method to cover the first insulator, the first oxide, the second oxide, the fourth insulator, and the third insulator; depositing a sixth insulator over the fifth insulator; forming a first opening and a second opening in the fifth and sixth insulators, so that a top surface and a side surface of the second oxide are at least partly exposed in each of the first opening and the second opening; forming a third conductor to fill the first opening; and forming a fourth conductor to fill the second opening.

According to one embodiment of the present invention, a semiconductor device that can be miniaturized or highly integrated, a semiconductor device having good electrical characteristics, a semiconductor device with low off-state current, a transistor with high on-state current, a highly reliable semiconductor device, a semiconductor device with low power consumption, or a semiconductor device that can be manufactured with high productivity can be provided.

According to one embodiment of the present invention, a semiconductor device capable of retaining data for a long time, a semiconductor device capable of high-speed data writing, a semiconductor device with high design flexibility, a low-power semiconductor device, or a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 11A to 11C are a top view and cross-sectional views illustrating a method for manufacturing a semiconductor device of one embodiment of the present invention;

FIGS. 12A to 12C are a top view and cross-sectional views illustrating a method for manufacturing a semiconductor device of one embodiment of the present invention;

DETAILED DESCRIPTION OF THE INVENTION

Figure 1A:
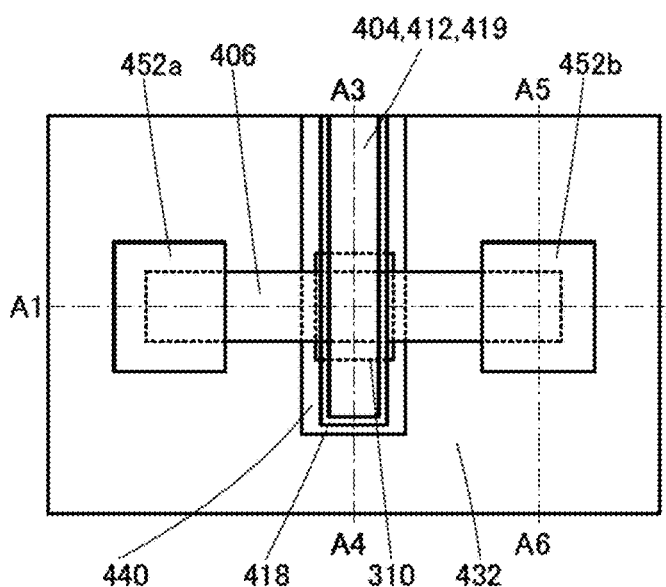
FIGS. 1A to 1C are a top view and cross-sectional views of a semiconductor device of one embodiment of the present invention.

Hereinafter, embodiments will be described with reference to drawings. Note that the embodiments can be implemented in various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Thus, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof is not repeated in some cases. Furthermore, the same hatching pattern is applied to portions having similar functions, and the portions are not denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Thus, for example, description can be made even when "first" is replaced with "second" or "third", as appropriate. In addition, the ordinal numbers in this specification and the like are not necessarily the same as those that specify one embodiment of the present invention.

In this specification, terms for describing placement, such as "over", "above", "under", and "below", are used for convenience in describing a positional relationship between components with reference to drawings. Furthermore, the positional relationship between components is changed as appropriate in accordance with a direction in which each component is described. Thus, description of the positional relationship can be rephrased appropriately according to the situation, without being limited by the terms used in this specification.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow between the source and the drain through the channel region. Note that in this specification and the like, a channel region refers to a region through which current mainly flows.

Furthermore, functions of the source and the drain might be switched when the transistor has opposite polarity or a direction of current flow is changed in circuit operation, for example. Thus, the terms "source" and "drain" can be interchanged with each other in this specification and the like in some cases.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer".

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is larger than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that in this specification, a barrier film refers to a film having a function of inhibiting the penetration of oxygen and impurities such as water or hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including an oxide or an oxide semiconductor.

Embodiment 1

Structure Example of Semiconductor Device

An example of a semiconductor device of one embodiment of the present invention will be described below.

Figure 1C:
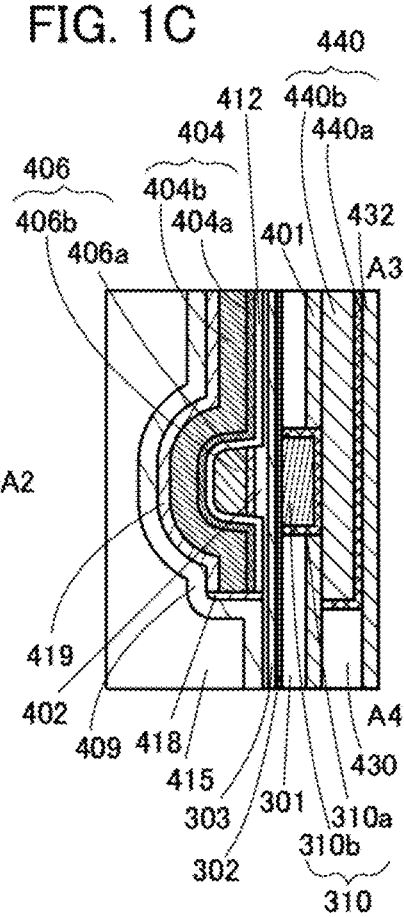
Figure 1B:
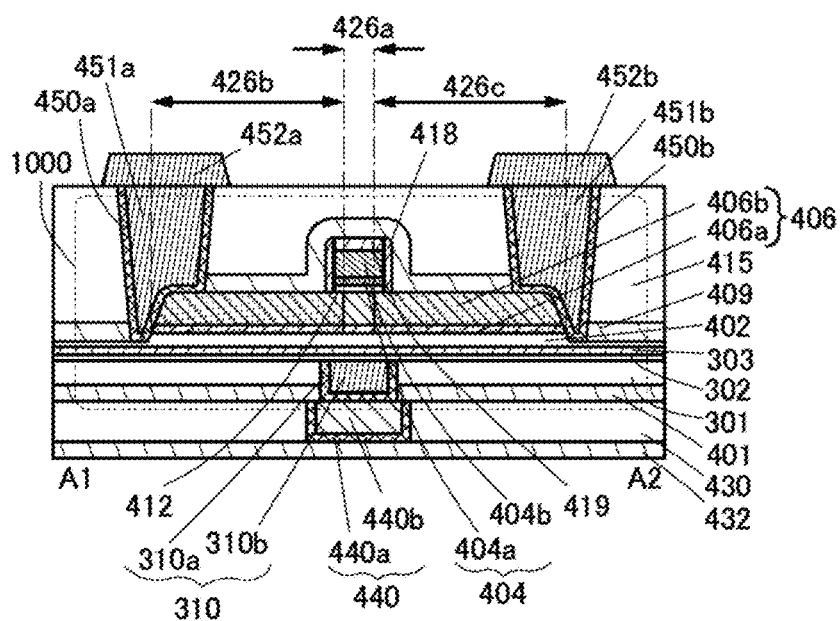

FIG. 1A is a top view of a semiconductor device including a transistor 1000. FIG. 1B is a cross-sectional view taken along the dashed-dotted line A1-A2 in FIG. 1A, which corresponds to a cross-sectional view in the channel length direction of the transistor 1000. FIG. 1C is a cross-sectional view taken along the dashed-dotted line A3-A4 in FIG. 1A, which corresponds to a cross-sectional view in the channel width direction of the transistor 1000. Note that for simplification of the drawing, some components in the top view in FIG. 1A are not illustrated.

As illustrated in FIGS. 1A to 1C, the transistor 1000 includes an insulator 402 provided over a substrate (not shown); an oxide 406a provided over the insulator 402; an oxide 406b provided in contact with at least a portion of the top surface of the oxide 406a; an insulator 412 provided over the oxide 406b; a conductor 404a provided over the insulator 412; a conductor 404b provided over the conductor 404a; an insulator 419 provided over the conductor 404b, an insulator 418 provided in contact with side surfaces of the insulator 412, the conductor 404a, the conductor 404b, and the insulator 419; and an insulator 409 provided in contact with the top surface of the oxide 406b and a side surface of the insulator 418. As illustrated in FIG. 1B, it is preferable that the top surface of the insulator 418 be substantially aligned with the top surface of the insulator 419. Furthermore, it is preferable that the insulator 409 be provided to cover the insulator 419, the conductor 404, the insulator 418, and the oxide 406.

Hereinafter, the oxide 406a and the oxide 406b may be collectively referred to as an oxide 406. Although the transistor 1000 has a structure in which the oxide 406a and the oxide 406b are stacked, one embodiment of the present invention is not limited to this structure. For example, a structure in which only the oxide 406b is provided may be employed. Furthermore, the conductor 404a and the conductor 404b may be collectively referred to as a conductor 404. Although the transistor 1000 has a structure in which the conductor 404a and the conductor 404b are stacked, one embodiment of the present invention is not limited to this structure. For example, a structure in which only the conductor 404b is provided may be employed.

The transistor 1000 may have a structure in which an insulator 432 is provided over the substrate. The transistor 1000 may include an insulator 430 provided over the insulator 432, and a conductor 440 embedded in the insulator 430. An insulator 401 may be provided over the insulator 430, and an insulator 301 may be provided over the insulator 401. The transistor 1000 may include a conductor 310 embedded in the insulators 401 and 301. The conductor 310 is preferably provided to be in contact with the top surface of the conductor 440 and to overlap with the oxide 406 and the conductor 404. The transistor 1000 may further include an insulator 302 provided over the insulator 301 and the conductor 310, and an insulator 303 provided over the insulator 302, in which case the insulator 402 is provided over the insulator 303.

In the conductor 440, a conductor 440a is formed in contact with an inner wall of an opening in the insulator 430, and a conductor 440b is formed on the inner side. Here, the top surfaces of the conductors 440a and 440b can have substantially the same level as the top surface of the insulator 430. Although the transistor 1000 has a structure in which the conductor 440a and the conductor 440b are stacked, the structure of the present invention is not limited thereto. For example, only the conductor 440b may be provided.

In the conductor 310, a conductor 310a is formed in contact with an inner wall of an opening in the insulators 401 and 301, and a conductor 310b is formed on the inner side. Thus, the conductor 310a is preferably in contact with the conductor 440b. Here, the top surfaces of the conductors 310a and 310b can have substantially the same level as the top surface of the insulator 301. Although the transistor 1000 has a structure in which the conductor 310a and the conductor 310b are stacked, the structure of the present invention is not limited thereto. For example, only the conductor 310b may be provided.

The conductor 404 can serve as a top gate (which may also be referred to as a first gate), and the conductor 310 can serve as a back gate (which may also be referred to as a second gate). The potential of the back gate may be the same as that of the top gate, the ground potential, or a given potential. By changing the potential of the back gate independently of the potential of the top gate, the threshold voltage of the transistor can be changed.

The conductor 440 extends in the channel width direction in a similar manner to the conductor 404, and serves as a wiring through which a potential is applied to the conductor 310 (i.e., the back gate). When the conductor 310 which is embedded in the insulators 401 and 301 is stacked over the conductor 440 serving as the wiring for the back gate, the insulators 401 and 301 and the like are positioned between the conductor 440 and the conductor 404, whereby the parasitic capacitance between the conductor 440 and the conductor 404 can be reduced and the withstand voltage can be increased. The reduction in the parasitic capacitance between the conductor 440 and the conductor 404 can improve the switching speed of the transistor, so that the transistor can have high frequency characteristics. The increase in the withstand voltage between the conductor 440 and the conductor 404 can improve the reliability of the transistor 1000. Thus, the thicknesses of the insulator 401 and the insulator 301 are preferably large. Note that the extending direction of the conductor 440 is not limited to this example. The conductor 440 may extend in the channel length direction of the transistor 1000, for example.

Each of the conductor 310a and the conductor 440a is preferably formed using a conductive material having a function of inhibiting the penetration of impurities such as water or hydrogen (a conductive material that is unlikely to transmit impurities). The conductor 310a is a single layer or a stacked layer, preferably formed using tantalum, tantalum nitride, ruthenium, ruthenium oxide, or the like. Accordingly, diffusion of impurities such as water or hydrogen from a layer under the insulator 432 into an upper layer through the conductors 440 and 310 can be inhibited. Note that it is preferable that each of the conductor 310a and the conductor 440a have a function of inhibiting the penetration of at least one of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom, and oxygen (e.g., an oxygen atom or an oxygen molecule). Furthermore, hereinafter, the same applies to the description of a conductive material that has a function of inhibiting the penetration of impurities. When each of the conductor 310a and the conductor 440a has a function of inhibiting the penetration of oxygen, the conductor 310b and the conductor 440b can be prevented from being oxidized and reduced in conductivity.

The conductor 310b is preferably formed using a conductive material containing tungsten, copper, or aluminum as its main component. Although not illustrated, the conductor 310b may have a stacked-layer structure. For example, titanium, titanium nitride, and the above conductive material may be stacked as the conductor 310b.

The conductor 440b, which serves as a wiring, is preferably formed using a conductor having a higher conductivity than the conductor 310b; a conductive material containing copper or aluminum as its main component can be used, for example. Although not shown, the conductor 440b may have a stacked layer structure, and for example, stacked layers of titanium, titanium nitride, and the above-described conductive material may be formed.

The insulator 432 and the insulator 401 can each serve as a barrier insulating film for preventing impurities such as water or hydrogen from entering the transistor from a lower layer. The insulator 432 and the insulator 401 are each preferably formed using an insulating material having a function of inhibiting the penetration of impurities such as water or hydrogen. For example, it is preferable that the insulator 432 be formed using aluminum oxide and the insulator 401 be formed using silicon nitride. In this way, impurities such as water or hydrogen can be inhibited from diffusing to layers above the insulators 432 and 401. Note that it is preferable that the insulators 432 and 401 each have a function of inhibiting the penetration of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material having a function of inhibiting the penetration of impurities.

Furthermore, each of the insulator 432 and the insulator 401 is preferably formed using an insulating material that has a function of inhibiting the penetration of oxygen (e.g., an oxygen atom or an oxygen molecule). Thus, oxygen contained in the insulator 402 or the like can be prevented from being diffused to lower layers.

Furthermore, with the structure in which the conductor 310 is stacked over the conductor 440, the insulator 401 can be provided between the conductor 440 and the conductor 310. Here, even when a metal that is easily diffused, such as coper, is used as the conductor 440b, silicon nitride or the like provided as the insulator 401 can prevent diffusion of the metal to a layer positioned above the insulator 401.

The insulator 303 is preferably formed using an insulating material that has a function of inhibiting the penetration of oxygen and impurities such as water or hydrogen, and is preferably formed using aluminum oxide or hafnium oxide, for example. Accordingly, diffusion of impurities such as water or hydrogen from a layer under the insulator 303 into a layer over the insulator 303 can be inhibited. Furthermore, oxygen contained in the insulator 402 or the like can be prevented from being diffused to lower layers.

Furthermore, the concentration of impurities such as water, hydrogen, or nitrogen oxide in the insulator 402 is preferably lowered. The amount of hydrogen released from the insulator 402, which is converted into hydrogen molecules per unit area of the insulator 402, is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) in the range of 50° C. to 500° C., for example. The insulator 402 is preferably formed using an insulator from which oxygen is released by heating.

The insulator 412 can serve as a first gate insulating film. The insulators 302, 303, and 402 can serve as second gate insulating films. Although the transistor 1000 has a structure in which the insulators 302, 303, and 402 are stacked, one embodiment of the present invention is not limited to this structure. For example, a structure in which any two selected from the insulators 302, 303, and 402 are stacked or a structure in which any one selected from the insulators 302, 303, and 402 is used may be employed.

The oxide 406 is preferably formed using a metal oxide serving as an oxide semiconductor (hereinafter, such a metal oxide may also be referred to simply as an oxide semiconductor). The metal oxide to be used preferably has an energy gap greater than or equal to 2 eV, more preferably greater than or equal to 2.5 eV. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be deposited by a sputtering method or the like, and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, a case where the oxide semiconductor is an In-M-Zn oxide containing indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, the atomic ratio of the element M to the constituent elements of the metal oxide used as the oxide 406a is preferably greater than that of the metal oxide used as the oxide 406b. Moreover, the atomic ratio of the element M to In in the metal oxide used as the oxide 406a is preferably greater than that in the metal oxide used as the oxide 406b. In addition, the atomic ratio of In to the element M in the metal oxide used as the oxide 406b is preferably greater than that in the metal oxide used as the oxide 406a.

When using the above metal oxide as the oxide 406a, it is preferable that the conduction band minimum of the oxide 406a be higher than the conduction band minimum of the region of the oxide 406b where the conduction band minimum is low. In other words, the electron affinity of the oxide 406a is preferably smaller than the electron affinity of the region of the oxide 406b where the conduction band minimum is low.

Here, the energy level of the conduction band minimum is gradually varied in the oxides 406a and 406b. In other words, the energy level of the conduction band minimum is continuously varied or continuously connected. To vary the energy level gradually, the density of defect states in a mixed layer formed at the interface between the oxides 406a and 406b is decreased.

Specifically, when the oxides 406a and 406b contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as the oxide 406a.

At this time, a narrow-gap portion formed in the oxide 406b serves as a main carrier path. Since the density of defect states at the interface between the oxides 406a and 406b can be decreased, the influence of interface scattering on carrier conduction is small, and high on-state current can be obtained.

The oxide 406 includes a region 426a, a region 426b, and a region 426c. As illustrated in FIG. 1B, the region 426a is sandwiched between the region 426b and the region 426c. The regions 426b and 426c are reduced in resistance through formation of the insulator 409, and are high in conductivity than the region 426a. Impurity elements such as hydrogen or nitrogen, which are contained in an atmosphere where the insulator 409 is formed, are added to the regions 426b and 426c. Accordingly, oxygen vacancies are formed because of the added impurity elements, and the impurity elements enter the oxygen vacancies, thereby increasing the carrier density and reducing resistance mainly in a region of the oxide 406b that overlaps with the insulator 409.

Thus, it is preferable that the concentration of at least one of hydrogen and nitrogen be higher in the regions 426b and 426c than in the region 426a. The concentration of hydrogen or nitrogen is measured by secondary ion mass spectrometry (SIMS) or the like. As the concentration of hydrogen or nitrogen in the region 426a, the concentration of hydrogen or nitrogen near the center of a region of the oxide 406b that overlaps with the insulator 412 (e.g., a portion of the oxide 406b, which is substantially equally away from the left and right side surfaces of the insulator 412 in the channel length direction) is measured.

The regions 426b and 426c are reduced in resistance when an element forming an oxygen vacancy or an element bonded to an oxygen vacancy is added thereto.

Typical examples of such an element are hydrogen, boron, carbon, nitrogen, fluorine, phosphorus, sulfur, chlorine, titanium, and a rare gas element. Typical examples of the rare gas element are helium, neon, argon, krypton, and xenon. Accordingly, the regions 426b and 426c are made to include one or more of the above elements.

It is preferable in the oxide 406a that the atomic ratio of In to the element M in the regions 426b and 426c be substantially the same as that in the oxide 406b. In other words, in the oxide 406a, the atomic ratio of In to the element M in the regions 426b and 426c is preferably greater than that in the region 426a. Here, when the indium content in the oxide 406 is increased, the carrier density is increased and the resistance can be decreased. With this structure, even when the thickness of the oxide 406b is small and electric resistance of the oxide 406b is high in the manufacturing process of the transistor 1000, the regions 426b and 426c in the oxide 406 can serve as source and drain regions owing to the sufficiently reduced resistance of the oxide 406a in the regions 426b and 426c.

Figure 2A:
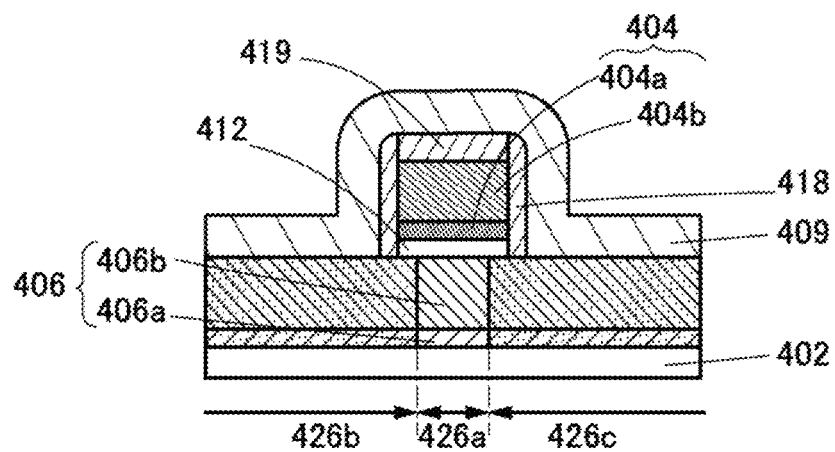
FIGS. 2A and 2B are each a cross-sectional view of a semiconductor device of one embodiment of the present invention.

FIG. 2A is an enlarged view of the region 426a and its vicinity illustrated in FIG. 1B. As illustrated in FIG. 2A, the regions 426b and 426c are formed in regions of the oxide 406 that overlap with at least the insulator 409. One of the regions 426b and 426c of the oxide 406b can serve as a source region, and the other can serve as a drain region. The region 426a of the oxide 406b can serve as a channel formation region.

Although the regions 426a, 426b, and 426c are formed in the oxides 406b and 406a in FIG. 1B and FIG. 2A, it is acceptable as long as the regions 426a, 426b, and 426c are formed at least in the oxide 406b. Although the boundary between the regions 426a and 426b and the boundary between the regions 426a and 426c are substantially perpendicular to the top surface of the oxide 406 in FIG. 1B and the like, one embodiment of the present invention is not limited thereto. For example, the region 426b is shaped such that it recedes to the A1 (in FIG. 1B) side near the bottom surface of the oxide 406a and the region 426c is shaped such that it recedes to the A2 (in FIG. 1B) side near the bottom surface of the oxide 406a, in some cases.

In the transistor 1000, as illustrated in FIG. 2A, the regions 426b and 426c are formed in regions of the oxide 406 which are in contact with the insulator 409, and regions of the oxide 406 which overlap with the insulator 418 and end portions of the insulator 412. In that case, portions of the regions 426b and 426c that overlap with the conductor 404 serve as what we call overlap regions (also referred to as Lov regions). With the Lov regions, no high-resistance region is formed between the channel formation region and the source or drain region of the oxide 406; accordingly, the on-state current and mobility of the transistor can be increased.

Figure 2B:
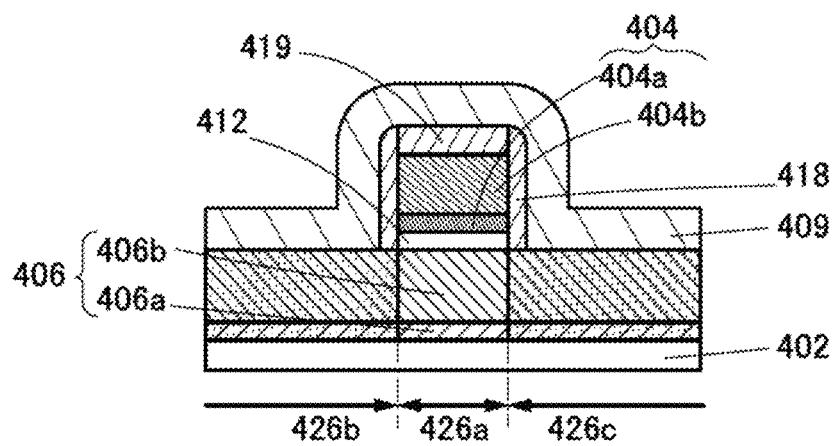

However, the semiconductor device described in this embodiment is not limited to the above-described structure. For example, as illustrated in FIG. 2B, the regions 426b and 426c may be formed in regions of the oxide 406 that overlap with the insulator 409 and the insulator 418. The structure illustrated in FIG. 2B can be rephrased as the structure in which the width of the conductor 404 in the channel length direction is substantially the same as the width of the region 426a. Because a high-resistance region is not formed between the source region and the drain region in the structure illustrated in FIG. 2B, the on-state current of the transistor can be increased. Since the gate does not overlap with the source and drain regions in the channel length direction in the structure illustrated in FIG. 2B, formation of unnecessary capacitance can be suppressed.

By appropriately selecting the areas of the regions 426b and 426c in the above manners, a transistor having desired electrical characteristics can be easily provided in accordance with the circuit design.

The insulator 412 is preferably provided in contact with the top surface of the oxide 406b. The insulator 412 is preferably formed using an insulator from which oxygen is released by heating. When the insulator 412 formed using such a material is provided in contact with the top surface of the oxide 406b, oxygen can be supplied to the oxide 406b effectively. Furthermore, the concentration of impurities such as water or hydrogen in the insulator 412 is preferably lowered as in the insulator 402. The thickness of the insulator 412 is preferably 1 nm to 20 nm inclusive (e.g., approximately 1 nm).

The insulator 412 preferably contains oxygen. The amount of oxygen released from the insulator 412, which is converted into oxygen molecules per unit area of the insulator 412, is more than or equal to $1\times10^{14}$ molecules/cm$^2$, preferably more than or equal to $2\times10^{14}$ molecules/cm$^2$, further preferably more than or equal to $4\times10^{14}$ molecules/cm$^2$ in thermal desorption spectroscopy (TDS) in the range of the surface temperatures from 100° C. to 700° C. inclusive or from 100° C. to 500° C. inclusive, for example.

The insulator 412, the conductor 404, and the insulator 419 have regions overlapping with the oxide 406b. In addition, it is preferable that side surfaces of the insulator 412, the conductor 404a, the conductor 404b, and the insulator 419 be substantially aligned with each other.

The conductor 404a is preferably formed using a conductive oxide. For example, the metal oxide that can be used as the oxide 406a or the oxide 406b can be used for the conductor 404a. In particular, an In—Ga—Zn-based oxide with an atomic ratio of In:Ga:Zn=4:2:3 to 4:2:4.1 or in the neighborhood thereof, which has high conductivity, is preferably used. When the conductor 404a is formed using such a material, oxygen can be prevented from entering the conductor 404b, and an increase in electric resistance value of the conductor 404b due to oxidation can be prevented.

In addition, by depositing such a conductive oxide by sputtering, oxygen can be added to the insulator 412, which makes it possible to supply oxygen to the oxide 406b. Thus, oxygen vacancies in the region 426a of the oxide 406 can be reduced.

The conductor 404b can be formed using a metal such as tungsten, for example. It is also possible to use, as the conductor 404b, a conductor that can add impurities such as nitrogen to the conductor 404a to improve the conductivity of the conductor 404a. For example, titanium nitride or the like is preferably used for the conductor 404b. Alternatively, the conductor 404b may be a stack including a metal nitride such as titanium nitride and a metal such as tungsten thereover.

Here, the conductor 404 functioning as a gate electrode is provided to cover the top surface of the region 426a and its periphery and the side surface, which is in the channel width direction, of the oxide 406b with the insulator 412 interposed therebetween. Thus, the electric field of the conductor 404 functioning as a gate electrode can electrically surround the top surface of the region 426a and its periphery and the side surface, which is in the channel width direction, of the oxide 406b. The structure of the transistor in which the channel formation region is electrically surrounded by the electric field of the conductor 404 is referred to as a surrounded channel (s-channel) structure. Thus, a channel can be formed in the top surface of the region 426a and its periphery and the side surface, which is in the channel width direction, of the oxide 406b; therefore, a large amount of current can flow between the source and the drain, and a current in an on state (on-state current) can be large. Moreover, since the top surface of the region 426a and its periphery and the side surface, which is in the channel width direction, of the oxide 406b are surrounded by the electric field of the conductor 404, a leakage current in an off state (off-state current) can be small.

The insulator 419 is preferably provided over the conductor 404b. In addition, it is preferable that side surfaces of the insulator 419, the conductor 404a, the conductor 404b, and the insulator 412 be substantially aligned with each other. The insulator 419 is preferably formed by an atomic layer deposition (ALD) method. In that case, the insulator 419 can be formed with a thickness of approximately 1 nm to 20 nm inclusive, preferably approximately 5 nm to 10 nm inclusive. Similarly to the insulator 418, the insulator 419 is preferably formed using an insulating material having a function of inhibiting the penetration of oxygen and impurities such as water or hydrogen, and is preferably formed using aluminum oxide or hafnium oxide, for example.

When the insulator 419 is provided as described above, the insulator 419 and the insulator 418 each of which has a function of inhibiting the penetration of oxygen and impurities such as water or hydrogen can cover the top and side surfaces of the conductor 404. This can prevent entry of impurities such as water or hydrogen into the oxide 406 through the conductor 404. Thus, the insulator 418 and the insulator 419 have a function of a gate cap that protects the gate.

The insulator 418 is provided in contact with the side surfaces of the insulator 412, the conductor 404, and the insulator 419. Furthermore, it is preferable that the top surface of the insulator 418 be substantially aligned with the top surface of the insulator 419. The insulator 418 is preferably deposited by an ALD method, in which case the thickness of the insulator 418 can be approximately 1 nm to 20 nm inclusive, preferably approximately 1 nm to 3 nm (e.g., 1 nm). Note that a precursor used in the ALD method sometimes contains impurities such as carbon. Thus, the insulator 418 may contain impurities such as carbon. In the case where the insulator 401 is formed by sputtering and the insulator 418 is formed by an ALD method, for example, the insulator 418 may contain more impurities such as carbon than the insulator 401 even when the insulators 418 and 401 are both formed using aluminum oxide. Note that impurities can be quantified by X-ray photoelectron spectroscopy (XPS).

As mentioned above, the regions 426b and 426c of the oxide 406 are formed because of the impurity elements added in the formation of the insulator 409. In the case where a transistor is miniaturized to have a channel length of approximately 10 nm to 30 nm inclusive, impurity elements contained in a source region or a drain region may diffuse and the source region and the drain region may be electrically connected to each other. By contrast, when the insulator 418 is formed as described in this embodiment, the distance between two regions of the oxide 406 that are in contact with the insulator 409 can be longer; thus, the source region and the drain region can be prevented from being electrically connected to each other. Moreover, the insulator 418 formed by an ALD method can have a thickness substantially equal to or less than a miniaturized channel length, which can prevent the distance between the source and drain regions from being longer than necessary and the resistance from increasing.

The insulator 418 is preferably formed using an insulating material that has a function of inhibiting the penetration of oxygen and impurities such as water or hydrogen, and is preferably formed using aluminum oxide or hafnium oxide, for example. In this manner, oxygen in the insulator 412 can be prevented from diffusing outward. In addition, impurities such as water or hydrogen can be prevented from entering the oxide 406 through the side of the insulator 412 or the like.

The insulator 418 is preferably formed in the following manner: an insulating film is deposited by an ALD method and then subjected to anisotropic etching so that a portion of the insulating film in contact with the side surfaces of the insulator 412, the conductor 404, and the insulator 419 remains. Thus, the insulator 418 having a small thickness as described above can be easily formed. At this time, even when the insulator 419 provided over the conductor 404 is partly removed by the anisotropic etching, the portion of the insulator 418 in contact with the insulator 412 and the conductor 404 can be left sufficiently.

The insulator 409 is provided to cover the insulator 419, the insulator 418, the oxide 406, and the insulator 402. Here, the insulator 409 is provided in contact with the top surfaces of the insulators 419 and 418 and the side surface of the insulator 418. As mentioned above, the insulator 409 adds impurities such as hydrogen or nitrogen to the oxide 406 to form the regions 426b and 426c. Thus, the insulator 409 preferably contains at least one of hydrogen and nitrogen.

Furthermore, the insulator 409 is preferably provided in contact with side surfaces of the oxides 406b and 406a as well as the top surface of the oxide 406b. This enables a resistance reduction to the side surfaces of the oxides 406b and 406a in the regions 426b 426c.

The insulator 409 is preferably formed using an insulating material that has a function of inhibiting the penetration of oxygen and impurities such as water or hydrogen. For example, the insulator 409 is preferably formed using silicon nitride, silicon nitride oxide, silicon oxynitride, aluminum nitride, or aluminum nitride oxide. When the insulator 409 is formed using any of the above materials, entry of oxygen through the insulator 409 to be supplied to oxygen vacancies in the regions 426b and 426c, which decreases the carrier density, can be prevented. In addition, entry of impurities such as water or hydrogen through the insulator 409, which causes the regions 426b and 426c to excessively extend to the region 426a side, can be prevented.

An insulator 415 is preferably provided over the insulator 409. The concentration of impurities such as water or hydrogen in the insulator 415 is preferably lowered as in the insulator 402 and the like. An insulator that is similar to the insulator 432 may be provided over the insulator 415.

In openings formed in the insulators 415 and 409, a combination of conductors 450a and 451a and a combination of conductors 450b and a conductor 451b are provided. The combination of conductors 450a and 451a and the combination of conductors 450b and 451b are preferably provided to face each other with the conductor 404 positioned therebetween.

Here, the conductor 450a is formed in contact with an inner wall of one opening in the insulators 415 and 409, and the conductor 451a is formed on the inner side. The region 426b of the oxide 406 is positioned in at least part of a bottom portion of the opening, and the conductor 450a is in contact with the region 426b. Similarly, the conductor 450b is formed in contact with an inner wall of the other opening in the insulators 415 and 409, and the conductor 451b is formed on the inner side. The region 426c of the oxide 406 is positioned in at least part of a bottom portion of the opening, and the conductor 450b is in contact with the region 426c.

Figure 3A:
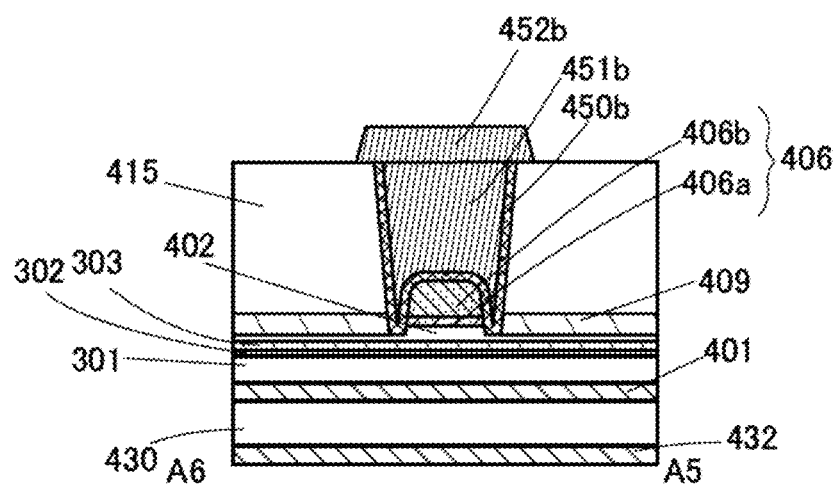
FIGS. 3A and 3B are each a cross-sectional view of a semiconductor device of one embodiment of the present invention.

Here, FIG. 3A is a cross-sectional view of a portion along the dashed-dotted line A5-A6 in FIG. 1A. Although the cross-sectional view in FIG. 3A illustrates the conductors 450b and 451b, the conductors 450a and 451a have a similar structure.

As illustrated in FIG. 1B and FIG. 3A, the conductor 450b is in contact with at least the top surface of the oxide 406 and is preferably in contact with the side surface of the oxide 406. Specifically, as illustrated in FIG. 3A, the conductor 450b is preferably in contact with one or both of side surfaces (the side surfaces on the A5 side and the A6 side) of the oxide 406 in the channel width direction. As illustrated in FIG. 1B, the conductor 450b may be in contact with the side surface on the A2 side of the oxide 406 in the channel length direction. Thus, when the structure in which the conductor 450b is in contact with the side surface of the oxide 406 in addition to the top surface of the oxide 406 is employed, the contact area between the conductor 450b and the oxide 406 can be increased without an increase in the area of the top surface of the contact portion, so that the contact resistance between the conductor 450b and the oxide 406 can be reduced. Accordingly, miniaturization of the source electrode and the drain electrode of the transistor can be achieved and, in addition, the on-state current can be increased. Note that the same applies to the conductor 450a and the conductor 451a.

Here, the conductor 450a is in contact with the region 426b serving as one of a source region and a drain region of the transistor 1000, and the conductor 450b is in contact with the region 426c serving as the other of the source region and the drain region of the transistor 1000. Thus, the conductors 450a and 451a can serve as one of a source electrode and a drain electrode, and the conductors 450b and 451b can serve as the other of the source electrode and the drain electrode. Because the region 426b and the region 426c are reduced in resistance, the contact resistance between the conductor 450a and the region 426b and the contact resistance between the conductor 450b and the region 426c are reduced, leading to a large on-state current of the transistor 1000.

Here, the conductor 450a and the conductor 450b are each preferably formed using a conductive material having a function of inhibiting the penetration of impurities such as water or hydrogen, like the conductor 310a or the like. For example, tantalum, tantalum nitride, titanium, titanium nitride, ruthenium, ruthenium oxide, or the like is preferably used, and a single layer or stacked layers may be used. This can prevent entry of impurities such as water or hydrogen from a layer positioned over the insulator 415 to the oxide 406 through the conductor 451a and the conductor 451b.

Furthermore, the conductor 451a and the conductor 451b are each preferably formed using a conductive material containing tungsten, copper, or aluminum as its main component. Although not shown, the conductor 451a and the conductor 451b may have a stacked layer structure, and for example, stacked layers of titanium, titanium nitride, and the above-described conductive material may be formed.

Note that although the conductor 450a and the conductor 450b are in contact with both the oxide 406a and the oxide 406b in FIG. 1B, one embodiment of the present invention is not limited to this example. For example, the structure in which the conductor 450a and the conductor 450b are in contact with only the oxide 406b may be employed. Furthermore, the top surfaces of the conductor 450a, the conductor 451a, the conductor 450b, and the conductor 451b can be on approximately the same level. Furthermore, although the transistor 1000 in which the conductor 450a and the conductor 451a are stacked and the conductor 450b and the conductor 451b are stacked is described here, one embodiment of the present invention is not limited to this example. For example, a structure in which only the conductor 451a and the conductor 451b are provided may be employed.

Figure 3B:
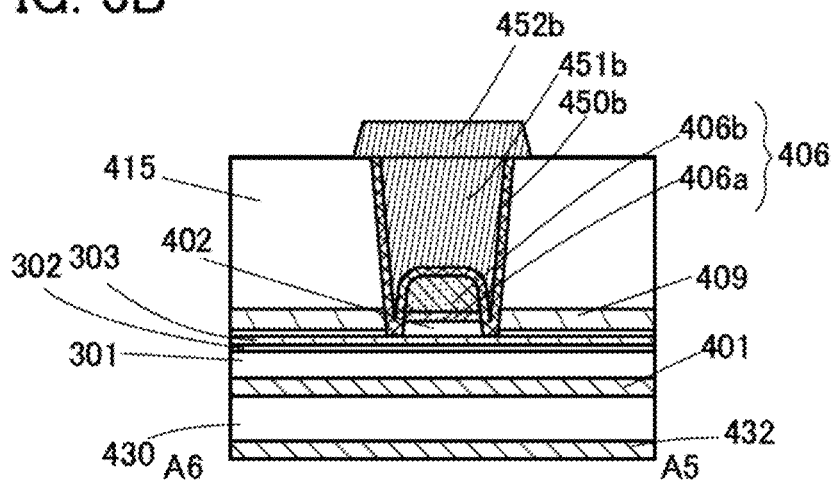

Moreover, although the insulator 402 serves as the bottom portion of the opening in which the conductor 450b (the conductor 450a) is provided in FIG. 3A, this embodiment is not limited to this structure. As illustrated in FIG. 3B, the insulator 303 may serve as the bottom portion of the opening in which the conductor 450b (the conductor 450a) is provided. In the structure illustrated in FIG. 3A, the conductor 450b (the conductor 450a) is in contact with the insulator 402, the oxide 406a, the oxide 406b, the insulator 409, and the insulator 415. In the structure illustrated in FIG. 3B, the conductor 450b (the conductor 450a) is in contact with the insulator 303, the insulator 402, the oxide 406a, the oxide 406b, the insulator 409, and the insulator 415.

It is preferable that a conductor 452a be provided in contact with the top surface of the conductor 451a and a conductor 452b be provided in contact with the top surface of the conductor 451b. The conductor 452a and the conductor 452b are each preferably formed using a conductive material containing tungsten, copper, or aluminum as its main component. Although not shown, the conductor 452a and the conductor 452b may each have a stacked layer structure, and for example, stacked layers of titanium or titanium nitride and the above-described conductive material may be formed. Note that the conductor 452a and the conductor 452b may be embedded in the openings provided in the insulators, in a similar manner to the conductor 440 or the like.

Next, components of the transistor 1000 will be described.

Substrate

As the substrate over which the transistor 1000 is formed, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. Examples of the semiconductor substrate also include a semiconductor substrate in which an insulator region is provided in the above semiconductor substrate, e.g., a silicon on insulator (SOI) substrate. Examples of the conductor substrate include a graphite substrate, a metal substrate, an alloy substrate, and a conductive resin substrate. Examples of the conductor substrate also include a substrate containing a metal nitride and a substrate containing a metal oxide. An insulator substrate provided with a conductor or a semiconductor, a semiconductor substrate provided with a conductor or an insulator, a conductor substrate provided with a semiconductor or an insulator, or the like can also be used. Alternatively, any of these substrates over which an element is provided may be used. As the element provided over the substrate, a capacitor, a resistor, a switching element, a light-emitting element, a memory element, or the like can be given.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a film, a foil, or a sheet containing a fiber may be used. The substrate may have elasticity. The substrate may have a property of returning to its original shape when bending or pulling is stopped. Alternatively, the substrate may have a property of not returning to its original shape. The substrate includes a region having a thickness of, for example, greater than or equal to 5 µm and less than or equal to 700 µm, preferably greater than or equal to 10 µm and less than or equal to 500 µm, and further preferably greater than or equal to 15 µm and less than or equal to 300 µm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate, which is caused by dropping or the like, can be reduced. That is, a durable semiconductor device can be provided.

For the substrate which is a flexible substrate, metal, an alloy, resin, glass, or fiber thereof can be used, for example. The flexible substrate preferably has a lower coefficient of linear expansion because deformation due to an environment is suppressed. The flexible substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is suitably used for the flexible substrate because of its low coefficient of linear expansion.

Insulator

The insulator can be an oxide, nitride, oxynitride, nitride oxide, metal oxide, metal oxynitride, metal nitride oxide, or the like having an insulating property.

Note that when the transistor is surrounded by an insulator that has a function of inhibiting the penetration of oxygen and impurities such as water or hydrogen, the electrical characteristics of the transistor can be stabilized. For example, an insulator that has a function of inhibiting the penetration of oxygen and impurities such as water or hydrogen is used for each of the insulators 303, 401, and 432.

The insulator that has a function of inhibiting the penetration of oxygen and impurities such as water or hydrogen can have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 303, 401, and 432 may each be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 303, 401, and 432 preferably contain aluminum oxide, hafnium oxide, or the like.

The insulators 430, 301, 302, 402, and 412 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 430, 301, 302, 402, and 412 each preferably contain silicon oxide, silicon oxynitride, or silicon nitride.

It is preferable that the insulator 302, the insulator 303, the insulator 402, and/or the insulator 412 be formed using an insulator with a high dielectric constant. For example, it is preferable that the insulator 302, the insulator 303, the insulator 402, and/or the insulator 412 contain gallium oxide, hafnium oxide, zirconium oxide, an oxide containing aluminum and hafnium, an oxynitride containing aluminum and hafnium, an oxide containing silicon and hafnium, an oxynitride containing silicon and hafnium, or a nitride containing silicon and hafnium. Alternatively, it is preferable that the insulator 302, the insulator 303, the insulator 402, and/or the insulator 412 have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when aluminum oxide, gallium oxide, or hafnium oxide is positioned in contact with the oxide 406 in each of the insulators 402 and 412, silicon contained in silicon oxide or silicon oxynitride can be prevented from entering the oxide 406. Furthermore, for example, when silicon oxide or silicon oxynitride is in contact with the oxide 406 in each of the insulators 402 and 412, trap centers might be formed at the interface between aluminum oxide, gallium oxide, or hafnium oxide and silicon oxide or silicon oxynitride. The trap centers can shift the threshold voltage of the transistor in the positive direction by trapping electrons, in some cases.

Each of the insulators 430, 301, and 415 preferably includes an insulator with a low dielectric constant. For example, each of the insulators 430, 301, and 415 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulators 430, 301, and 415 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

For each of the insulators 418 and 419, an insulator having a function of inhibiting the penetration of oxygen and impurities such as water or hydrogen is used. For each of the insulators 418 and 419, for example, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride can be used.

Conductor

The conductors 404a, 404b, 310a, 310b, 450a, 450b, 451a, 451b, 452a, and 452b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon containing an impurity element such as phosphorus, or silicide such as nickel silicide may be used.

For the above-described conductors, especially for the conductors 404a, 310a, 450a, and 450b, a conductive material containing oxygen and a metal element included in a metal oxide that can be used for the oxide 406 may be used. A conductive material containing the above-described metal element and nitrogen may be used. For example, a conductive material containing nitrogen such as titanium nitride or tantalum nitride may be used. An indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon is added may be used. An indium gallium zinc oxide containing nitrogen may be used. With the use of such a material, hydrogen contained in the oxide 406 can be captured in some cases. Alternatively, hydrogen entering from an external insulator or the like can be captured in some cases.

A stack including a plurality of conductive layers formed using the above materials may be used. For example, a stacked-layer structure formed using a combination of a material containing the above-described metal element and a conductive material containing oxygen may be used. Alternatively, a stacked-layer structure formed using a combination of a material containing the above-described metal element and a conductive material containing nitrogen may be used. Alternatively, a stacked-layer structure formed using a combination of a material containing the above-described metal element, a conductive material containing oxygen, and a conductive material including nitrogen may be used.

When the oxide is used for the channel formation region of the transistor, a stacked-layer structure formed using a material containing the above-described metal element and a conductive material containing oxygen is preferably used for the gate electrode. In that case, the conductive material containing oxygen is preferably formed on the channel formation region side. When the conductive material containing oxygen is formed on the channel formation region side, oxygen released from the conductive material is likely to be supplied to the channel formation region.

Metal Oxide Applicable to Oxide 406

The oxide 406 of the present invention will be described below. For the oxide 406, a metal oxide functioning as an oxide semiconductor (hereinafter, the metal oxide is also referred to as an oxide semiconductor) is preferably used.

The oxide semiconductor preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, or the like may be contained.

Here, a case where the oxide semiconductor is an In-M-Zn oxide containing indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, the case where the metal oxide contains indium, the element M, and zinc is considered.

Preferred ranges of the atomic ratio of indium to the element M and zinc contained in the metal oxide that can be used for the oxides 406a and 406b are described with reference to FIGS. 18A to 18C. Note that the proportion of oxygen atoms is not shown in FIGS. 18A to 18C. The terms of the atomic ratio of indium to the element M and zinc contained in the metal oxide are denoted by [In], [M], and [Zn], respectively.

Figure 18A:
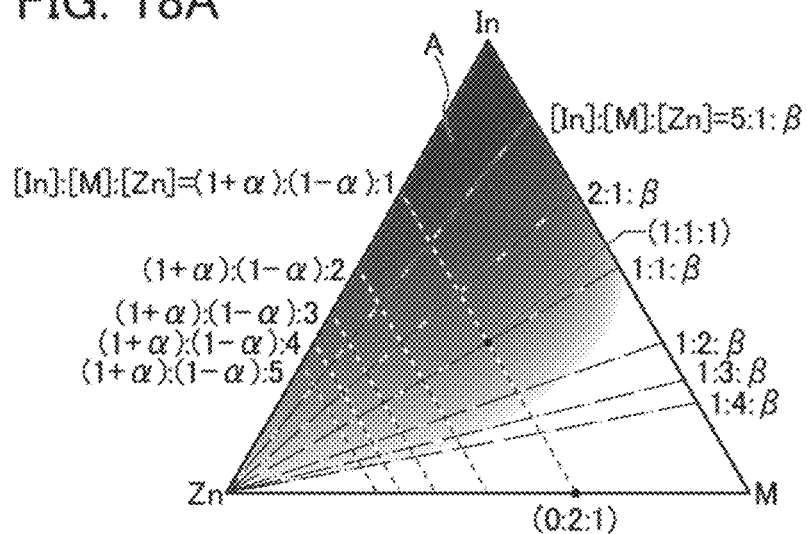
FIGS. 18A to 18C each show an atomic ratio range of a metal oxide of the present invention.
Figure 18B:
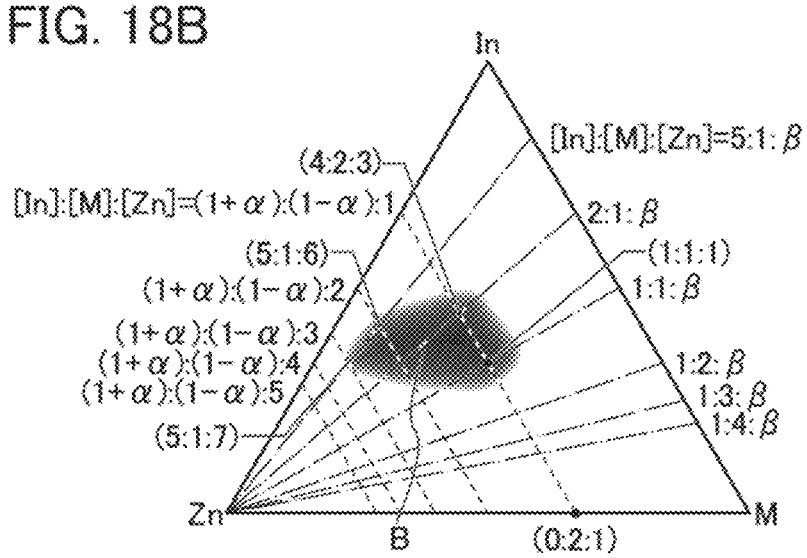
Figure 18C:
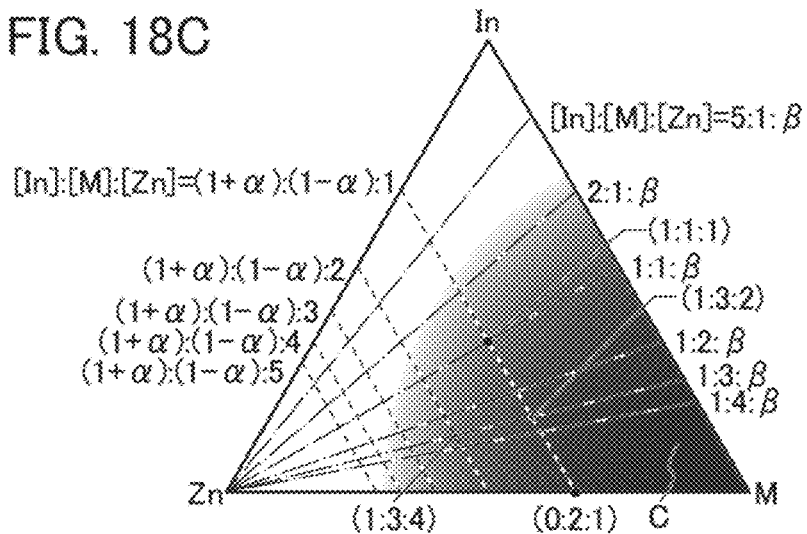

In FIGS. 18A to 18C, broken lines indicate a line where the atomic ratio [In]:[M]:[Zn] is $(1+\alpha):(1-\alpha):1(-1 \leq \alpha \leq 1)$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio [In]:[M]:[Zn] is $5:1:\beta$ $(\beta \geq 0)$, a line where the atomic ratio [In]:[M]:[Zn] is 2:1:β, a line where the atomic ratio [In]:[M]:[Zn] is 1:1:β, a line where the atomic ratio [In]:[M]:[Zn] is 1:2:β, a line where the atomic ratio [In]:[M]:[Zn] is 1:3:β, and a line where the atomic ratio [In]:[M]:[Zn] is 1:4:β.

Furthermore, a metal oxide with the atomic ratio of [In]:[M]:[Zn]=0:2:1 or a neighborhood thereof in FIGS. 18A to 18C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 18A represents an example of the preferred range of the atomic ratio of indium, the element M, and zinc contained in the metal oxide.

In addition, the metal oxide having a higher content of indium can have higher carrier mobility (electron mobility). Thus, a metal oxide having a high content of indium has higher carrier mobility than a metal oxide having a low content of indium.

By contrast, when the indium content and the zinc content in a metal oxide become lower, carrier mobility becomes lower. Thus, with an atomic ratio of [In]:[M]:[Zn]=0:1:0 and the vicinity thereof (e.g., a region C in FIG. 18C), insulation performance becomes better.

For example, the metal oxide used as the oxide 406b preferably has an atomic ratio represented by the region A in FIG. 18A. The metal oxide with the atomic ratio has high carrier mobility. The atomic ratio of In to Ga and Zn of the metal oxide used as the oxide 406b is 4:2:3 to 4:2:4.1 or in the neighborhood thereof, for example. By contrast, the metal oxide used as the oxide 406a preferably has an atomic ratio represented by the region C in FIG. 18C. The metal oxide with the atomic ratio has relatively high insulating properties. The atomic ratio of In to Ga and Zn of the metal oxide used as the oxide 406a is approximately 1:3:4.

A metal oxide having an atomic ratio in the region A, particularly in a region B in FIG. 18B, has high carrier mobility and high reliability and is excellent.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

In the case where the metal oxide is formed of an In-M-Zn oxide, it is preferable to use a target including a polycrystalline In-M-Zn oxide as the sputtering target. Note that the atomic ratio of the formed metal oxide varies from the above atomic ratios of metal elements of the sputtering targets in a range of ±40%. For example, when a sputtering target with an atomic ratio of In:Ga:Zn=4:2:4.1 is used for forming the metal oxide, the atomic ratio of In to Ga and Zn in the formed metal oxide may be 4:2:3 or in the neighborhood of 4:2:3. When a sputtering target with an atomic ratio of In:Ga:Zn=5:1:7 is used for forming the metal oxide, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of the target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

Composition of Metal Oxide

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

Structure of Metal Oxide

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

Transistor Containing Oxide Semiconductor

Next, the case where the oxide semiconductor is used for a transistor will be described.

When the oxide semiconductor is used in a transistor, the transistor can have high field-effect mobility. In addition, the transistor can have high reliability.

Moreover, the carrier density in the region $426a$ of the oxide $406b$ in the transistor is preferably low. In order to reduce the carrier density of the oxide semiconductor, the concentration of impurities in the oxide semiconductor is reduced so that the density of defect states can be reduced. In this specification and the like, a state with a low impurity concentration and a low density of defect states is referred to as a highly purified intrinsic or substantially highly purified intrinsic state. The region $426a$ of the oxide $406b$ has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in the oxide semiconductor having a high density of trap states has unstable electrical characteristics in some cases.

In order to obtain stable electrical characteristics of the transistor, it is effective to reduce the concentration of impurities in the region $426a$ of the oxide $406b$. In addition, in order to reduce the concentration of impurities in the region $426a$ of the oxide $406b$, the concentration of impurities in a film that is adjacent to the region $426a$ is preferably reduced. As examples of the impurities, hydrogen, nitrogen, alkali metal, alkaline earth metal, iron, nickel, silicon, and the like are given.

Impurity

Here, the influence of impurities in the oxide semiconductor is described.

When silicon or carbon that is one of Group 14 elements is contained in the oxide, defect states are formed. Thus, the concentration of silicon or carbon (the concentration is measured by SIMS) in the region $426a$ of the oxide $406b$ is set to be lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the region $426a$ of the oxide

406b. Specifically, the concentration of alkali metal or alkaline earth metal in the region 426a of the oxide 406b, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor containing nitrogen in the region 426a of the oxide 406b tends to have normally-on characteristics. For this reason, nitrogen in the region 426a of the oxide 406b is preferably reduced as much as possible; for example, the concentration of nitrogen in the region 426a of the oxide 406b measured by SIMS is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the transistor including much hydrogen in the region 426a of the oxide 406b tends to have normally-on characteristics. For this reason, hydrogen in the region 426a of the oxide 406b is preferably reduced as much as possible. Specifically, the hydrogen concentration of the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

By reducing impurities in the region 426a of the oxide 406b to an enough level, the transistor can have stable electrical characteristics.

Method for Manufacturing Semiconductor Device

Next, a method for manufacturing the transistor 1000 of the present invention will be described with reference to FIGS. 1A to 1C, FIGS. 4A to 4C to FIGS. 13A to 13C, and FIG. 14. FIG. 1A and FIG. 4A to FIG. 13A are top views, FIG. 1B and FIG. 4B to FIG. 13B are cross-sectional views taken along the dashed-dotted lines A1-A2 in FIG. 1A and FIG. 4A to FIG. 13A, and FIG. 1C and FIG. 4C to FIG. 13C are cross-sectional views taken along the dashed-dotted lines A3-A4 in FIG. 1A and FIG. 4A to FIG. 13A.

First, the substrate (not shown) is prepared, and the insulator 432 is deposited over the substrate. The insulator 432 can be deposited by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The use of a PECVD method can provide a high-quality film at a relatively low temperature. A thermal CVD method does not use plasma and thus causes less plasma damage to an object. A wiring, an electrode, an element (e.g., a transistor or a capacitor), or the like included in a semiconductor device might be charged up by receiving charges from plasma, for example. In that case, accumulated charges might break the wiring, electrode, element, or the like included in the semiconductor device. By contrast, when a thermal CVD method not using plasma is employed, such plasma damage is not caused and the yield of semiconductor devices can be increased. A thermal CVD method does not cause plasma damage during deposition, so that a film with few defects can be obtained.

An ALD method also causes less plasma damage to an object. Since an ALD method does not cause plasma damage during deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method can provide favorable step coverage almost regardless of the shape of an object. In particular, an ALD method can provide excellent step coverage and excellent thickness uniformity and thus can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with the flow rate ratio of a source gas. For example, by a CVD method or an ALD method, a film with a certain composition can be formed depending on the flow rate ratio of a source gas. Moreover, by changing the flow rate ratio of a source gas during deposition by a CVD method or an ALD method, a film whose composition is continuously changed can be formed. In the case where a film is formed while changing the flow rate ratio of a source gas, as compared to the case where a film is formed using a plurality of deposition chambers, time taken for the deposition can be reduced because time taken for transfer and pressure adjustment is omitted. Thus, semiconductor devices can be manufactured with improved productivity in some cases.

In this embodiment, as the insulator 432, aluminum oxide is deposited by a sputtering method. The insulator 432 may have a multilayer structure. For example, aluminum oxide may be deposited by a sputtering method and another aluminum oxide may be deposited by an ALD method over the aluminum oxide. Alternatively, aluminum oxide may be deposited by an ALD method and another aluminum oxide may be deposited by a sputtering method over the aluminum oxide.

Next, the insulator 430 is deposited over the insulator 432. The insulator 430 can be deposited by a sputtering method, a CVD method, an MBE method, a PLD method, an ALD method, or the like. In this embodiment, as the insulator 430, silicon oxide is deposited by a CVD method.

Then, a groove is formed in the insulator 430 so as to reach the insulator 432. Examples of the groove include a hole and an opening. The groove may be formed by wet etching; however, dry etching is preferred for microfabrication. The insulator 432 is preferably an insulator that serves as an etching stopper film when forming the groove by etching the insulator 430. For example, in the case where a silicon oxide film is used as the insulator 430 in which the groove is to be formed, a silicon nitride film, an aluminum oxide film, or a hafnium oxide film is used as the insulator 432.

After the formation of the groove, a conductor to be the conductor 440a is deposited. The conductor to be the conductor 440a desirably contains a conductor that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 440a can be deposited by a sputtering method, a CVD method, an MBE method, a PLD method, an ALD method, or the like.

In this embodiment, a film of tantalum nitride or a film including tantalum nitride and titanium nitride stacked thereover is deposited by a sputtering method as the conductor to be the conductor 440a. In the case where such a metal nitride is used as the conductor 440a, even when a metal that is easy to diffuse (e.g., copper) is used for the conductor 440b described later, the metal can be prevented from diffusing outward through the conductor 440a.

Then, a conductor to be the conductor 440b is deposited over the conductor to be the conductor 440a. The conductor to be the conductor 440b can be deposited by a sputtering method, a CVD method, an MBE method, a PLD method, an ALD method, or the like. In this embodiment, a low-resistance conductive material such as copper is deposited as the conductor to be the conductor 440b.

Then, CMP treatment is performed so that the conductor to be the conductor 440a and the conductor to be the conductor 440b which are above the insulator 430 are removed. Consequently, the conductor to be the conductor 440a and the conductor to be the conductor 440b remain only in the groove, whereby the conductor 440 that includes the conductor 440a and the conductor 440b with flat top surfaces can be formed (see FIGS. 4A to 4C).

Then, the insulator 401 is deposited over the conductor 440 and the insulator 430. The insulator 401 can be deposited by a sputtering method, a CVD method, an MBE method, a PLD method, an ALD method, or the like. In this embodiment, as the insulator 401, silicon nitride is deposited by a CVD method. As described here, an insulator that is unlikely to allow the penetration of copper, such as silicon nitride, is used as the insulator 401; accordingly, even when a metal that is easy to diffuse (e.g., copper) is used for the conductor 440b, the metal can be prevented from diffusing to layers over the insulator 401.

Next, the insulator 301 is deposited over the insulator 401. The insulator 301 can be deposited by a sputtering method, a CVD method, an MBE method, a PLD method, an ALD method, or the like. In this embodiment, as the insulator 301, silicon oxide is deposited by a CVD method.

Next, a groove that reaches the conductor 440 is formed in the insulators 401 and 301. Examples of the groove include a hole and an opening. The groove may be formed by wet etching; however, dry etching is preferred for microfabrication.

After the formation of the groove, a conductor to be the conductor 310a is deposited. The conductor to be the conductor 310a desirably contains a conductor that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 310a can be deposited by a sputtering method, a CVD method, an MBE method, a PLD method, an ALD method, or the like.

In this embodiment, tantalum nitride is deposited by a sputtering method for the conductor to be the conductor 310a.

Then, a conductor to be the conductor 310b is deposited over the conductor to be the conductor 310a. The conductor to be the conductor 310b can be deposited by a sputtering method, a CVD method, an MBE method, a PLD method, an ALD method, or the like.

In this embodiment, for the conductor to be the conductor 310b, titanium nitride is deposited by a CVD method and tungsten is deposited by a CVD method over the titanium nitride.

Next, CMP treatment is performed to remove the conductor to be the conductor 310a and the conductor to be the conductor 310b that are located over the insulator 301. Consequently, the conductor to be the conductor 310a and the conductor to be the conductor 310b remain only in the groove, whereby the conductor 310 that includes the conductor 310a and the conductor 310b with flat top surfaces can be formed (see FIGS. 4A to 4C).

Then, the insulator 302 is deposited over the insulator 301 and the conductor 310. The insulator 302 can be deposited by a sputtering method, a CVD method, an MBE method, a PLD method, an ALD method, or the like.

Subsequently, the insulator 303 is deposited over the insulator 302. The insulator 303 can be deposited by a sputtering method, a CVD method, an MBE method, a PLD method, an ALD method, or the like.

After that, the insulator 402 is deposited over the insulator 303. The insulator 402 can be deposited by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. The first heat treatment is performed in a nitrogen atmosphere, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen. By the first heat treatment, impurities such as water or hydrogen contained in the insulator 402 can be removed, for example. In the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 402. Alternatively, after plasma treatment using an inert gas is performed with the apparatus, plasma treatment using oxygen may be performed in order to compensate for released oxygen. Note that the first heat treatment is not necessary in some cases.

Alternatively, heat treatment can be performed after the formation of the insulator 302, after the formation of the insulator 303, and after the formation of the insulator 402. Although each heat treatment can be performed under the conditions for the first heat treatment, the heat treatment after the formation of the insulator 302 is preferably performed in an atmosphere containing nitrogen.

In this embodiment, the first heat treatment is performed in such a manner that treatment at 400° C. in a nitrogen atmosphere is performed for one hour after the insulator 402 is formed and then treatment at 400° C. in an oxygen atmosphere is successively performed for one hour.

Figure 4A:
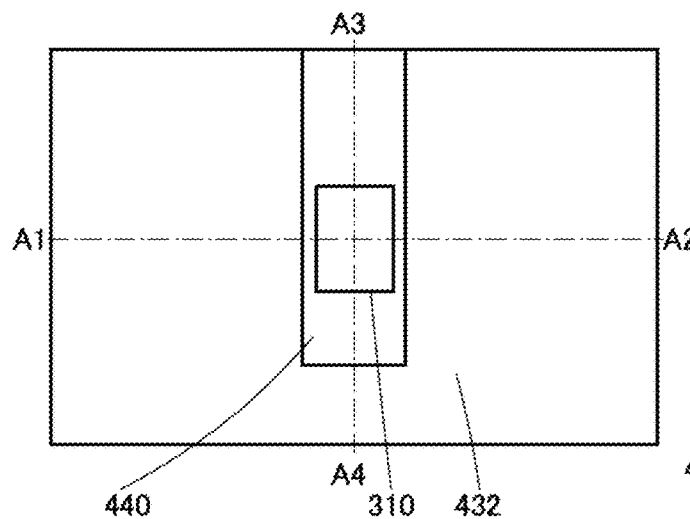
FIGS. 4A to 4C are a top view and cross-sectional views illustrating a method for manufacturing a semiconductor device of one embodiment of the present invention.
Figure 4C:
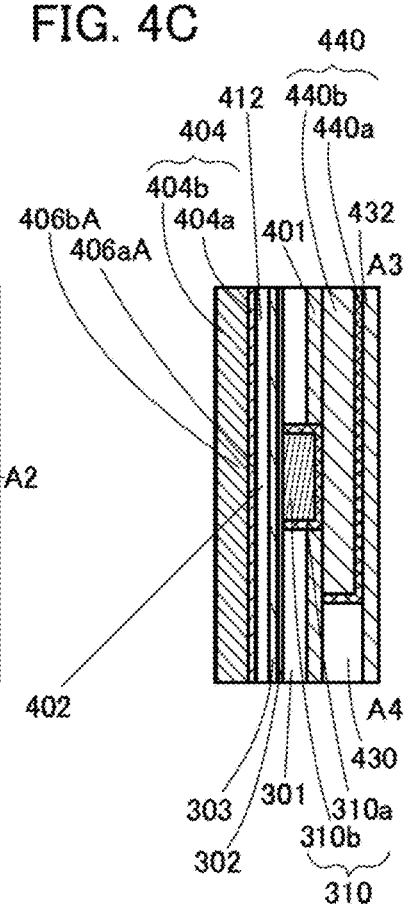
Figure 4B:
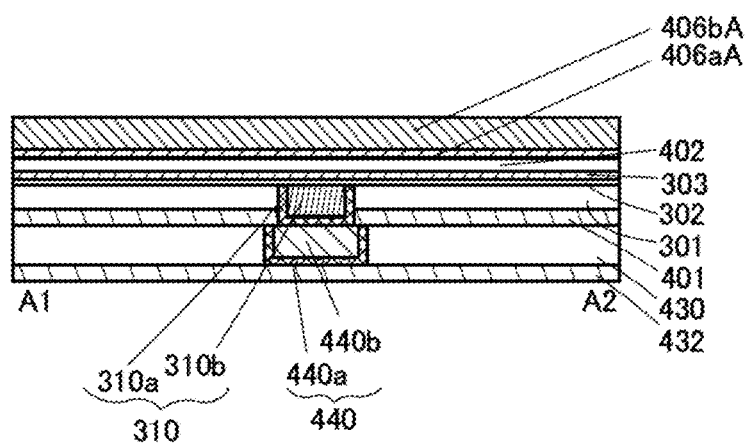

Next, an oxide film 406aA and an oxide film 406bA are deposited in this order over the insulator 402 (see FIGS. 4A to 4C). Note that it is preferable to deposit the oxide film 406aA and the oxide film 406bA successively without exposure to the air. In that case, an impurity or moisture in the air can be prevented from being attached onto the oxide film 406aA, and the interface between the oxide film 406aA and the oxide film 406bA and the vicinity thereof can be kept clean.

The oxide films 406aA and 406bA can be deposited by a sputtering method, a CVD method, an MBE method, a PLD method, an ALD method, or the like.

In the case where the oxide films 406aA and 406bA are deposited by a sputtering method, for example, oxygen or a mixed gas of oxygen and a rare gas is used as a sputtering gas. When the proportion of oxygen in the sputtering gas is increased, the amount of excess oxygen in the oxide films to be formed can be increased. In the case where the oxide films 406aA and 406bA are deposited by a sputtering method, the above-described In-M-Zn oxide target can be used.

In particular, part of oxygen contained in the sputtering gas is supplied to the insulator 402 in some cases, at the formation of the oxide film 406aA.

Note that the proportion of oxygen contained in the sputtering gas for the oxide film 406aA is 70% or higher, preferably 80% or higher, and further preferably 100%.

The oxide film 406bA is formed by a sputtering method. At this time, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In the case where an oxygen-deficient oxide semiconductor is used for the oxide film 406bA, an oxide film containing excess oxygen is preferably used as the oxide film 406aA. Oxygen doping treatment may be performed after the formation of the oxide film 406bA.

In this embodiment, the oxide film 406aA is deposited by a sputtering method using a target containing In, Ga, and Zn at an atomic ratio of 1:3:4, and the oxide film 406bA is deposited by a sputtering method using a target containing In, Ga, and Zn at an atomic ratio of 4:2:4.1.

After that, second heat treatment may be performed. For the second heat treatment, the conditions for the first heat treatment can be used. By the second heat treatment, impurities such as water or hydrogen contained in the oxide films 406aA and 406bA can be removed, for example. In this embodiment, the second heat treatment is performed in such a manner that treatment at 400° C. in a nitrogen atmosphere is performed for one hour and then treatment at 400° C. in an oxygen atmosphere is successively performed for one hour.

Figure 5A:
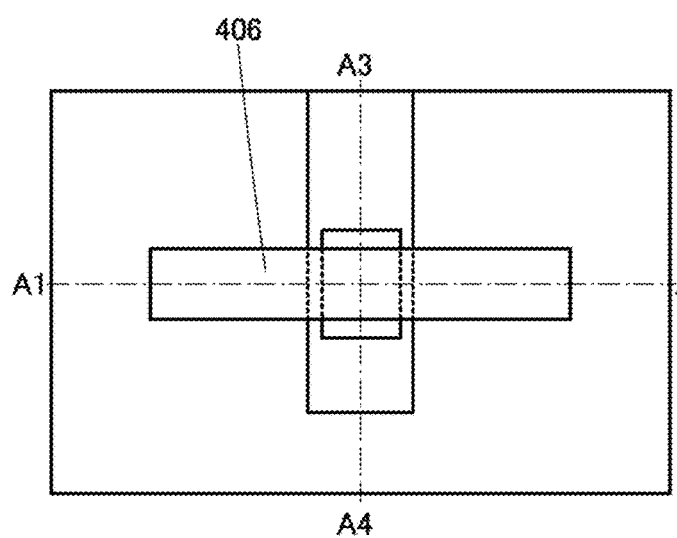
FIGS. 5A to 5C are a top view and cross-sectional views illustrating a method for manufacturing a semiconductor device of one embodiment of the present invention.
Figure 5C:
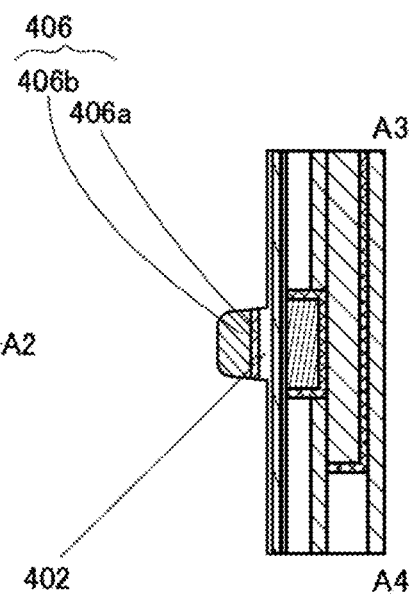
Figure 5B:
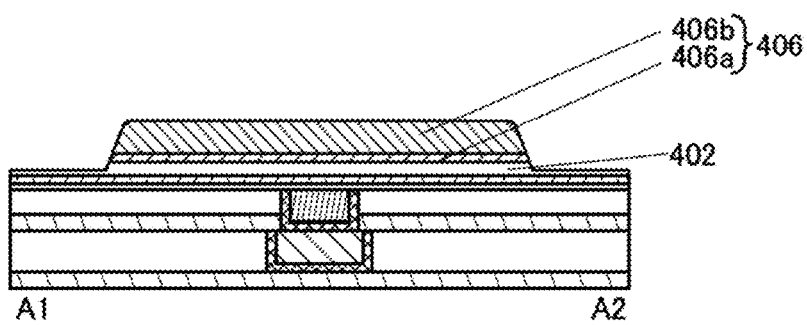

Then, the oxide films 406aA and 406bA are processed into island shapes to form the oxides 406a and 406b (see FIGS. 5A to 5C). Here, the oxides 406a and 406b are formed so that at least parts thereof overlap with the conductor 310. The oxide films 406aA and 406bA can be processed by a lithography method. After the processing, the oxides 406a and 406b preferably have a tapered cross section. The taper angle to a plane parallel to the bottom surface of the substrate is greater than or equal to 30° and less than 75°, preferably greater than or equal to 30° and less than 70°. Owing to such a taper angle, the coverage with films formed later in the manufacturing process can be improved. The processing can be performed by a dry etching method or a wet etching method. A dry etching method is suitably used for microfabrication and the above-described processing into a tapered shape.

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light such as KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the oxide film 406bA, a resist mask is formed thereover, and then the material of the hard mask is etched. The etching of the oxide films 406aA and 406bA may be performed after or without removal of the resist mask. In the latter case, the resist mask may be removed during the etching. The hard mask may be removed by etching after the etching of the oxide films 406aA and 406bA. The hard mask does not need to be removed in the case where the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers are applied to one of the parallel plate electrodes. Further alternatively, high-frequency powers with the same frequency are applied to the parallel plate electrodes. Still further alternatively, high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

In some cases, treatment such as dry etching performed in the above process causes the attachment or diffusion of impurities due to an etching gas or the like to a surface or an inside of the oxide 406a, the oxide 406b, or the like. Examples of the impurities include fluorine and chlorine.

To remove the impurities or the like, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, third heat treatment may be performed. For the third heat treatment, the conditions for the first heat treatment can be used. Note that the third heat treatment is not necessary in some cases. In this embodiment, the third heat treatment is not performed.

Figure 6A:
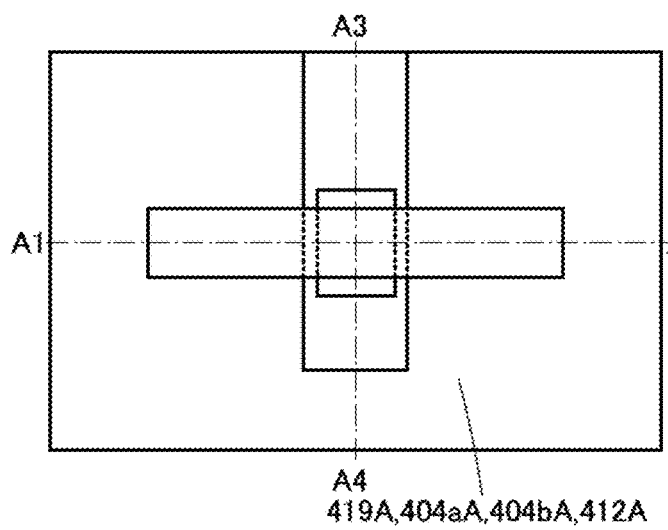
FIGS. 6A to 6C are a top view and cross-sectional views illustrating a method for manufacturing a semiconductor device of one embodiment of the present invention.
Figure 6C:
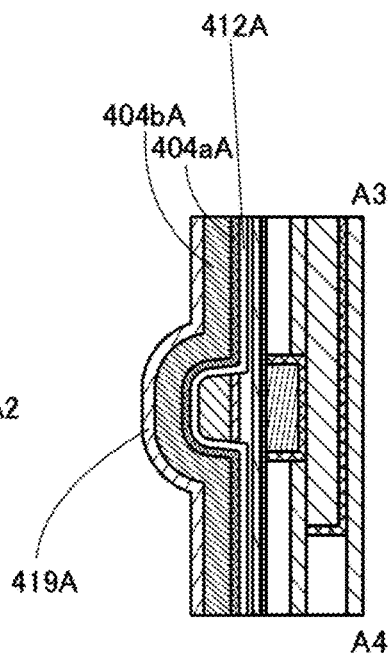
Figure 6B:
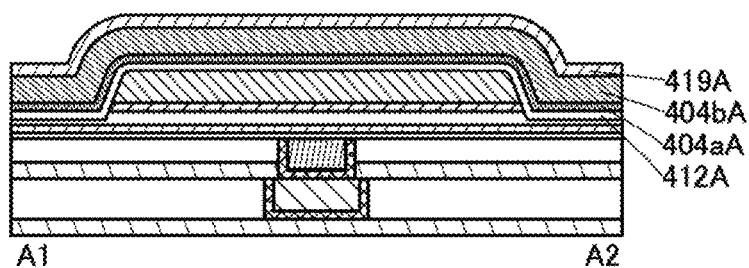

Then, an insulating film 412A, a conductive film 404aA, a conductive film 404bA, and an insulating film 419A are deposited in this order over the insulator 402 and the oxides 406a and 406b (see FIGS. 6A to 6C).

The insulating film 412A can be deposited by a sputtering method, a CVD method, an MBE method, a PLD method, an ALD method, or the like.

Here, fourth heat treatment can be performed. For this heat treatment, the conditions for the first heat treatment can be used. The fourth heat treatment can reduce the moisture concentration and the hydrogen concentration in the insulating film 412A. Note that the fourth heat treatment is not necessary in some cases.

The conductive film 404aA can be deposited by a sputtering method, a CVD method, an MBE method, a PLD method, an ALD method, or the like. By depositing the above-described conductive oxide that can be used for the conductor 404a by a sputtering method in an oxygen-containing atmosphere to form the conductive film 404aA, oxygen can be add to the insulator 412, which makes it possible to supply oxygen to the oxide 406b.

The conductive film 404bA can be deposited by a sputtering method, a CVD method, an MBE method, a PLD method, an ALD method, or the like. By forming the conductive film 404bA by a sputtering method, the conductive film 404aA can have reduced electric resistance and become a conductor. Such a conductor can be called an oxide conductor (OC) electrode. Another conductor may be deposited by a sputtering method or the like over the conductor over the OC electrode.

The insulating film 419A can be deposited by a sputtering method, a CVD method, an MBE method, a PLD method, an ALD method, or the like; and in particular, an ALD method is preferably used. When the insulating film 419A is deposited by an ALD method, the film thickness can be approximately 1 nm to 20 nm inclusive, preferably approximately 5 nm to 10 nm inclusive. The thickness of the insulating film 419A is preferably larger than that of an insulating film 418A to be the insulator 418. In that case, the insulator 419 is likely to be left over the conductor 404 in a later formation step of the insulator 418.

Here, fifth heat treatment can be performed. For the fifth heat treatment, the conditions for the first heat treatment can be used. Note that the fifth heat treatment is not necessary in some cases.

Figure 7A:
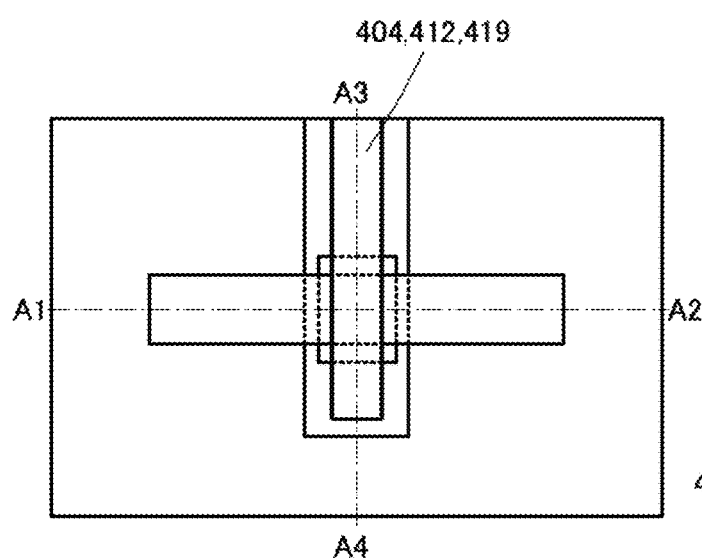
FIGS. 7A to 7C are a top view and cross-sectional views illustrating a method for manufacturing a semiconductor device of one embodiment of the present invention.
Figure 7C:
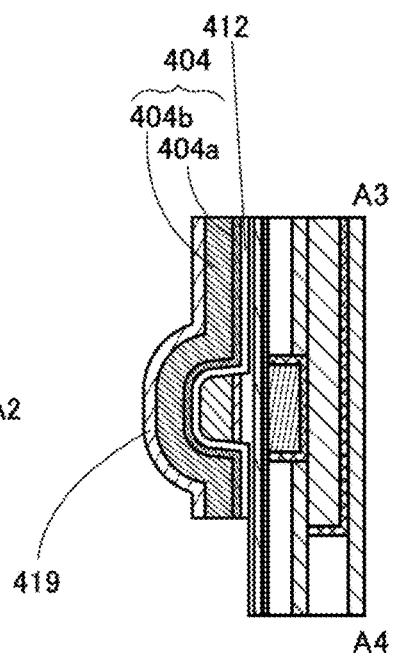
Figure 7B:
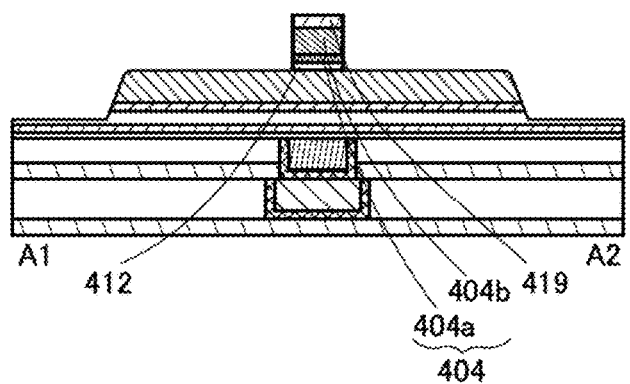

Next, the insulating film 412A, the conductive film 404aA, the conductive film 404bA, and the insulating film 419A are etched to form the insulator 412, the conductor 404a, the conductor 404b, and the insulator 419 (see FIGS. 7A to 7C). The insulator 412, the conductor 404a, the conductor 404b, and the insulator 419 are formed so that at least parts thereof overlap with the conductor 310 and the oxide 406. The processing of the insulating film 412A, the conductive film 404aA, the conductive film 404bA, and the insulating film 419A are performed by using a lithography method.

Here, a cross section of the insulator 412, the conductor 404a, the conductor 404b, and the insulator 419 is preferably tapered as little as possible. In that case, the insulator 418 is likely to be left in the later formation step of the insulator 418.

Note that an upper portion of the oxide 406b in a region not overlapping with the insulator 412 may be etched by the above etching. In that case, the oxide 406b is thicker in the region overlapping with the insulator 412 than in the region not overlapping with the insulator 412.

Figure 8A:
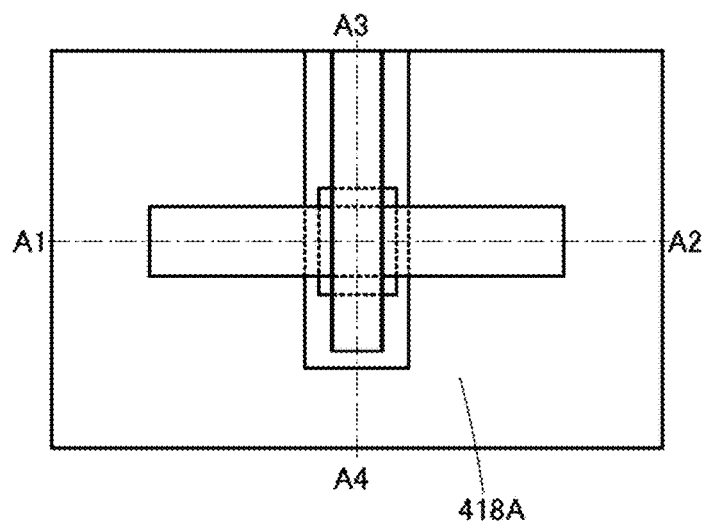
FIGS. 8A to 8C are a top view and cross-sectional views illustrating a method for manufacturing a semiconductor device of one embodiment of the present invention.
Figure 8C:
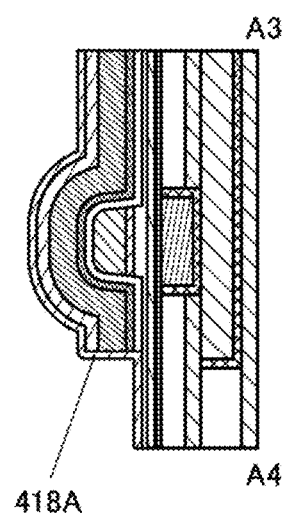
Figure 8B:
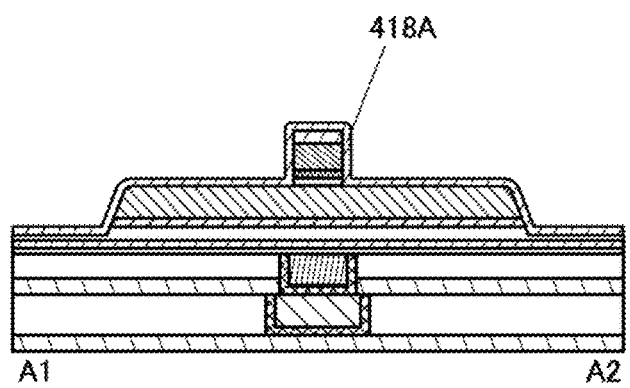

Next, an insulating film 418A is deposited by an ALD method so as to cover the insulator 402, the oxide 406, the insulator 412, the conductor 404, and the insulator 419 (see FIGS. 8A to 8C). When the insulating film 418A is deposited by an ALD method, the thickness of the insulating film 418A can be approximately 1 nm to 20 nm inclusive, preferably 1 nm to 3 nm inclusive (e.g., approximately 1 nm). Furthermore, even when the aspect ratio of a structure body formed of the insulator 412, the conductor 404, and the insulator 419 is extremely high, the insulating film 418A deposited by an ALD method can have few pinholes and uniform thickness on the top surface and a side surface of the structure body. In this embodiment, aluminum oxide is deposited by an ALD method as the insulating film 418A.

Figure 9A:
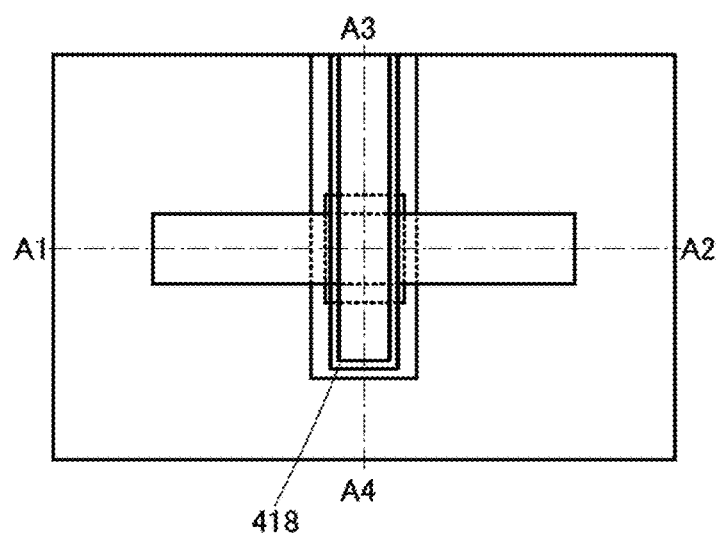
FIGS. 9A to 9C are a top view and cross-sectional views illustrating a method for manufacturing a semiconductor device of one embodiment of the present invention.
Figure 9C:
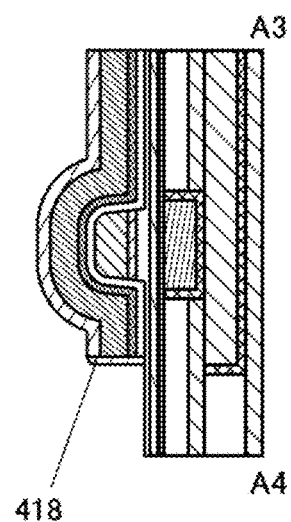
Figure 9B:
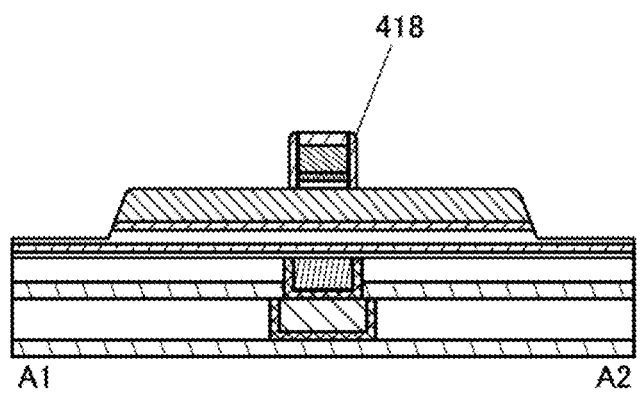

Then, anisotropic etching is performed on the insulating film 418A to form an insulator 418 on side surfaces of the insulator 412, the conductor 404, and the insulator 419 (see FIGS. 9A to 9C). Dry etching is preferably performed as the anisotropic etching. In this manner, the insulating film 418A in a region on a plane substantially parallel to the substrate surface can be removed, so that the insulator 418 can be formed in a self-aligned manner.

Here, the thickness of the insulator 419 is made larger than that of the insulating film 418A, so that the insulator 419 and the insulator 418 can be left even when upper portions of the insulator 419 and the insulator 418 are removed. Furthermore, when the oxide 406 has a tapered edge, the insulator 418 can be formed more easily because the insulating film 418A in a region in contact with a side surface of the oxide 406 can be removed in a shorter time.

A sidewall-shaped insulator may be left on the side surface of the oxide 406. The insulator on the side surface of the oxide 406 can reduce impurities such as water or hydrogen that enter the oxide 406 and can prevent outward diffusion of oxygen from the oxide 406, in some cases.

Figure 10A:
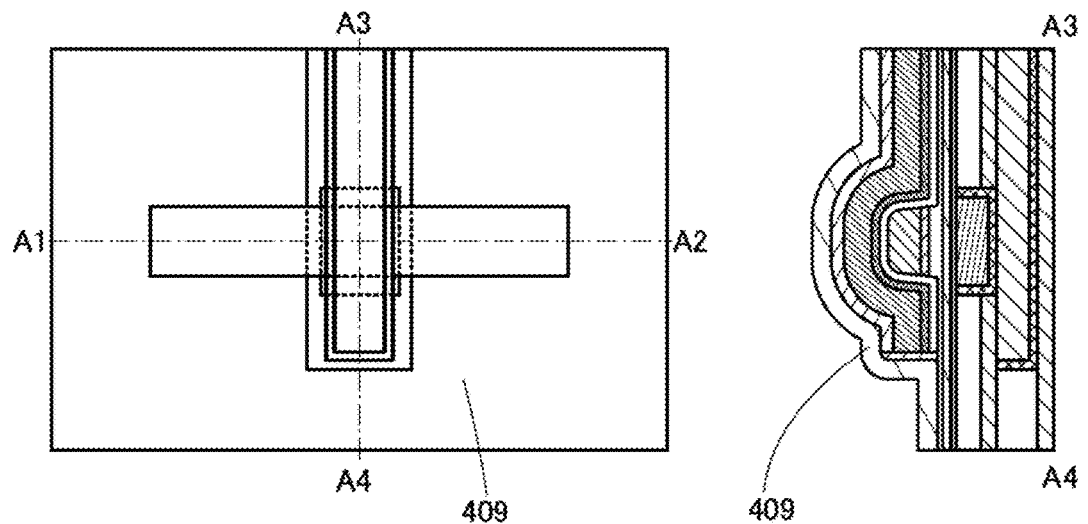
FIGS. 10A to 10C are a top view and cross-sectional views illustrating a method for manufacturing a semiconductor device of one embodiment of the present invention.
Figure 10C:
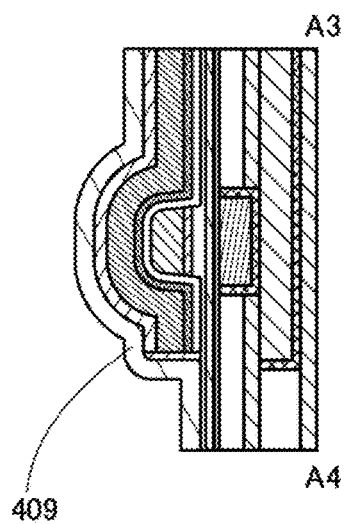
Figure 10B:
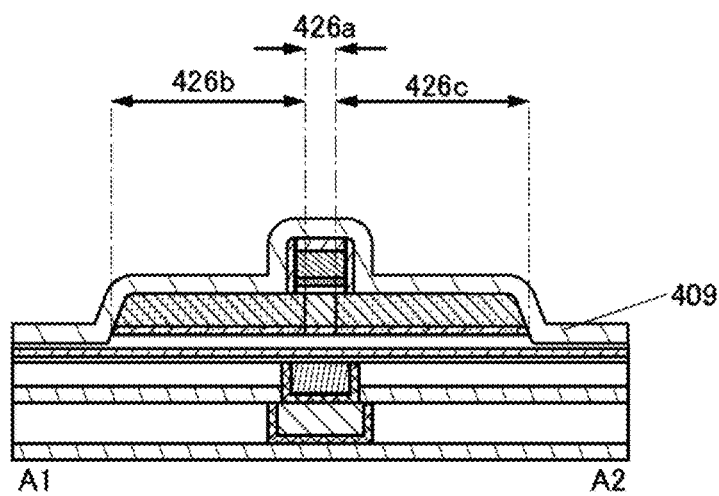

Next, an insulator 409 is deposited so as to cover the insulator 402, the oxide 406, the insulator 418, and the insulator 419 (see FIGS. 10A to 10C). The insulator 409 can be deposited by a sputtering method, a CVD method, an MBE method, a PLD method, an ALD method, or the like.

The insulator 409 is preferably deposited in an atmosphere containing at least one of nitrogen and hydrogen. In that case, oxygen vacancies are formed mainly in the region of the oxide 406b not overlapping with the insulator 412 and the oxygen vacancies and impurity elements such as nitrogen or hydrogen are bonded to each other, leading to an increase in carrier density. In this manner, the regions 426b and 426c with reduced resistance can be formed. For the insulator 409, for example, silicon nitride, silicon nitride oxide, or silicon oxynitride can be deposited by a CVD method. In this embodiment, silicon nitride oxide is used for the insulator 409.

As described above, in the method for manufacturing a semiconductor device described in this embodiment, a source region and a drain region can be formed in a self-aligned manner owing to the formation of the insulator 409, even in a minute transistor whose channel length is approximately 10 nm to 30 nm. Thus, minute or highly integrated semiconductor devices can be manufactured with high yield.

Here, the top and side surfaces of the conductor 404 and the insulator 412 are covered with the insulators 419 and 418, whereby impurity elements such as nitrogen or hydrogen can be prevented from entering the conductor 404 and the insulator 412. Thus, impurity elements such as nitrogen or hydrogen can be prevented from entering the region 426a serving as a channel formation region through the conductor 404 and the insulator 412, so that a transistor with good electrical characteristics can be provided.

Plasma treatment may be performed before the insulator 409 is deposited. The plasma treatment is performed in an atmosphere containing an element that forms the oxygen vacancies or an element bonded to the oxygen vacancies, for example.

The regions 426b and 426c may be formed in the oxide 406 only by plasma treatment. Note that an insulator having a function of inhibiting the penetration of oxygen and impurities such as water or hydrogen, as with the insulator 409 or the like, is preferably formed after the regions 426b and 426c are formed in the oxide 406. When such an insulator is provided over the regions 426b and 426c, oxygen and impurities such as water or hydrogen can be prevented from entering the regions 426b and 426c, leading to the prevention of a change in carrier density.

Next, an insulating film 415A is deposited over the insulator 409 (see FIGS. 11A to 11C). The insulating film 415A can be deposited by a sputtering method, a CVD method, an MBE method, a PLD method, an ALD method, or the like. Alternatively, the insulating film 415A can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulating film 415A.

Next, the insulating film 415A is partly removed to form the insulator 415 (see FIGS. 12A to 12C). The insulator 415 is preferably formed to have a flat top surface. The top surface of the insulator 415 may be flat immediately after the deposition (i.e., when deposited as the insulating film 415A), for example. Alternatively, the insulator 415 may have flatness in the following manner, for example: an insulator and the like are removed from the top surface after the deposition so that the top surface of the insulator 415 becomes parallel to a reference surface such as the rear surface of the substrate. Such treatment is referred to as planarization treatment. As the planarization treatment, for example, CMP treatment, dry etching treatment, or the like can be performed. In this embodiment, CMP treatment is performed as the planarization treatment. The arrows in FIGS. 12B and 12C indicate the direction in which the CMP treatment proceeds. Note that the top surface of the insulator 415 need not necessarily be flat.

Next, an opening that reaches the region 426b of the oxide 406 and an opening that reaches the region 426c of the oxide 406 are formed in the insulators 415 and 409. The openings are formed by using a lithography method. Here, the opening is formed such that the side surface of the oxide 406 is exposed in the opening, in which case the conductor 450a or the conductor 450b can be provided in contact with the side surface of the oxide 406b.

Next, a conductor to be the conductor 450a and the conductor 450b is deposited. The conductor to be the conductor 450a and the conductor 450b preferably contains a conductor having a function of inhibiting the penetration of impurities such as water or hydrogen. For example, tantalum nitride, titanium nitride, or the like can be used. The conductor to be the conductor 450a and the conductor 450b can be deposited by a sputtering method, a CVD method, an MBE method, a PLD method, an ALD method, or the like.

Then, a conductor to be the conductor 451a and the conductor 451b is deposited over the conductor to be the conductor 450a and the conductor 450b. The conductor to be the conductor 451a and the conductor 451b can be deposited by a sputtering method, a CVD method, an MBE method, a PLD method, an ALD method, or the like.

Then, the conductor to be the conductor 450a and the conductor 450b and the conductor to be the conductor 451a and the conductor 451b in portions above the insulator 415 are removed by CMP treatment. As a result, the conductors are left only in the above-described openings, so that the conductors 450a and 451a and the conductors 450b and 451b with flat top surfaces can be formed.

Figure 13A:
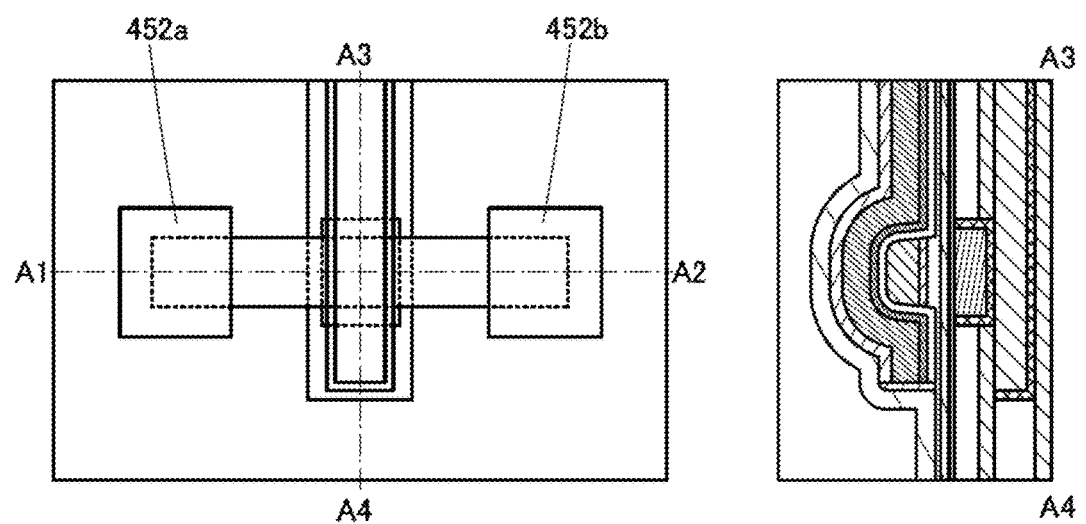
FIGS. 13A to 13C are a top view and cross-sectional views illustrating a method for manufacturing a semiconductor device of one embodiment of the present invention.
Figure 13C:
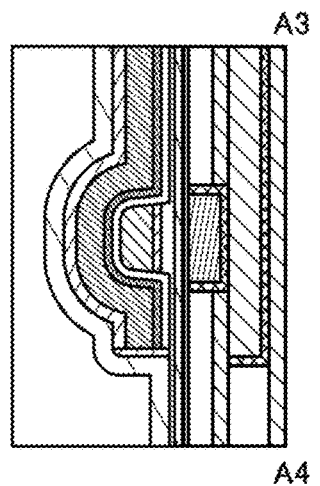
Figure 13B:
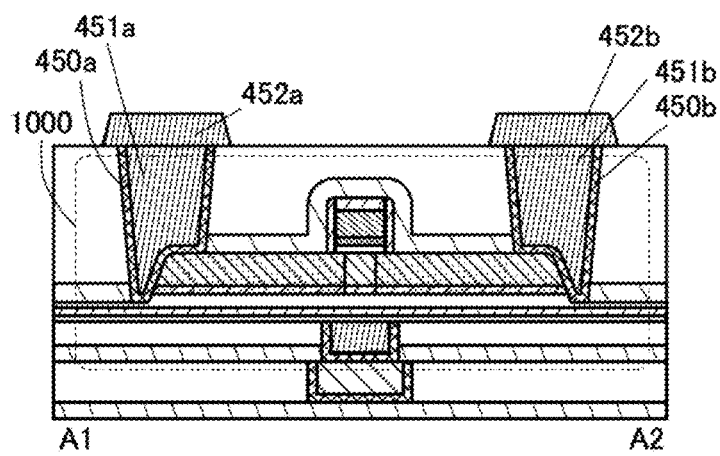

Next, a conductor is deposited and processed by using a photolithography method, whereby the conductor 452a and the conductor 452b are formed (see FIGS. 13A to 13C). The conductor to be the conductor 452a and the conductor 452b can be deposited by a sputtering method, a CVD method, an MBE method, a PLD method, an ALD method, or the like. The conductor 452a and the conductor 452b may be embedded in the insulator, in a similar manner to the conductor 440 or the like.

Through the above steps, the transistor 1000 can be manufactured (see FIGS. 1A to 1C).

In the above-described method for manufacturing a semiconductor device, the insulator 409 in contact with the oxide 406 is formed to form the regions 426b and 426c; however, the method for manufacturing a semiconductor device of this embodiment is not limited thereto. For example, a dopant may be added as illustrated in FIG. 14 to form the regions 426b and 426c.

Figure 14:
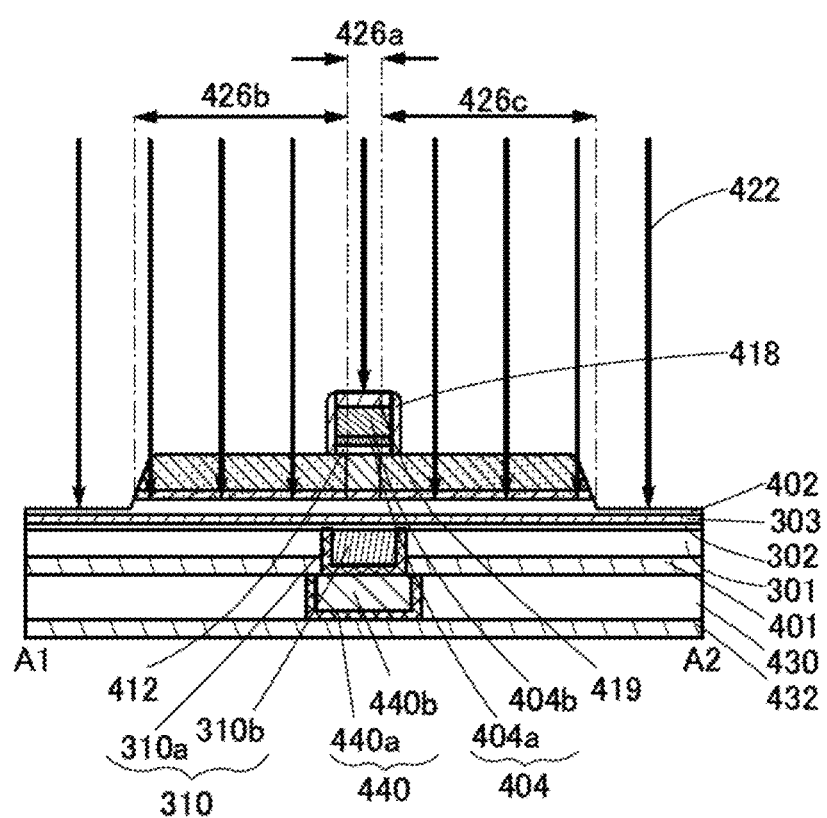
FIG. 14 is a cross-sectional view illustrating a method for manufacturing a semiconductor device of one embodiment of the present invention.

The step illustrated in FIG. 14 is performed after the formation of the insulator 418 illustrated in FIGS. 9A to 9C. As illustrated in FIG. 14, a dopant 422 is added to the oxide 406 using the insulator 412, the conductor 404, and the insulator 418 as masks.

For the addition of the dopant 422, an ion implantation method by which an ionized source gas is subjected to mass separation and then added, an ion doping method by which an ionized source gas is added without mass separation, a plasma immersion ion implantation method, or the like can be used. In the case where mass separation is performed, an ion species to be added and its concentration can be strictly controlled. By contrast, in the case where mass separation is not performed, ions at a high concentration can be added in a short time. Alternatively, an ion doping method in which atomic or molecular clusters are generated and ionized may be employed. Instead of the term "dopant," the term "ion," "donor," "acceptor," "impurity," "element," or the like may be used.

As the dopant 422, the element that forms an oxygen vacancy, the element bonded to an oxygen vacancy, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

As described above, when the indium content in the oxide 406 is increased, the carrier density is increased and the resistance can be decreased. Thus, a metal element such as indium, which increases the carrier density of the oxide 406, can be used as the dopant 422. Here, it is preferable that the dopant 422 be added such that the peak of the indium concentration is in the oxide 406a.

With indium added in this manner, it is preferable in the oxide 406a that the atomic ratio of indium to the element M in the regions 426b and 426c be substantially the same as that in the oxide 406b. In other words, in the oxide 406a, the atomic ratio of indium to the element M in the regions 426b and 426c is preferably greater than that in the region 426a.

With indium added in the above manner, even when the thickness of the oxide 406b is small and electric resistance of the oxide 406b is high in the manufacturing process of the transistor 1000, the region 426b and the region 426c in the oxide 406 can serve as source and drain regions owing to the sufficiently reduced resistance of the oxide 406a in the region 426b and the region 426c.

Although the dopant 422 is added substantially perpendicularly to the top surface of the insulator 419 in FIG. 14, one embodiment of the present invention is not limited thereto. The dopant 422 may be added obliquely to the top surface of the insulator 419.

An insulator having a function of inhibiting the penetration of oxygen and impurities such as water or hydrogen, as with the insulator 409 or the like, is preferably formed after the regions 426b and 426c are formed in the oxide 406 in the above-described manner. When such an insulator is provided over the regions 426b and 426c, oxygen and impurities such as water or hydrogen can be prevented from entering the regions 426b and 426c, leading to the prevention of a change in carrier density.

Modification Example

The structure of the semiconductor device described in this embodiment is not limited to the structure in FIGS. 1A to 1C. Hereinafter, modification examples of the transistor described in this embodiment will be described with reference to FIGS. 15A to 15C, FIGS. 16A to 16C, and FIGS. 17A to 17C.

Figure 15A:
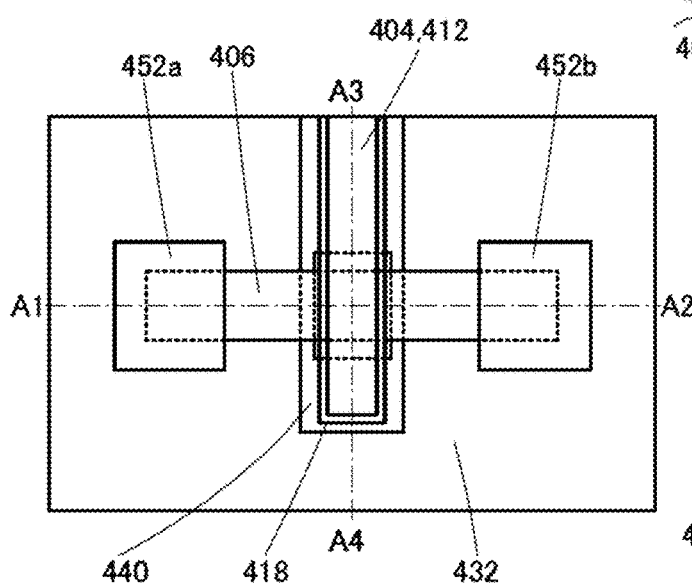
FIGS. 15A to 15C are a top view and cross-sectional views of a semiconductor device of one embodiment of the present invention.
Figure 15C:
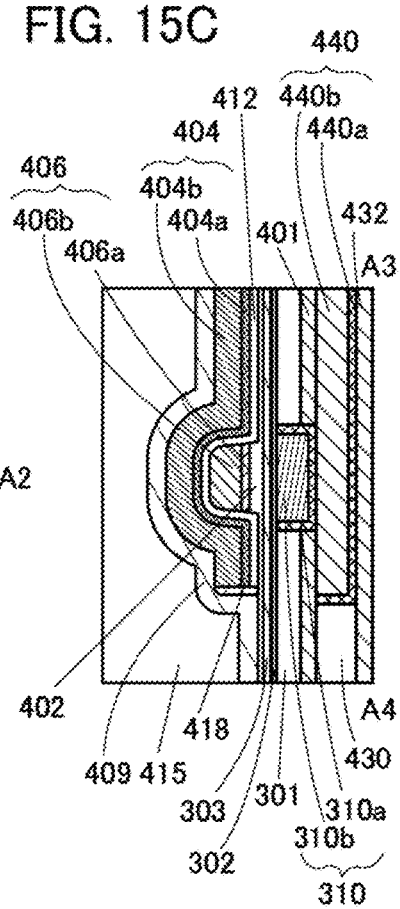
Figure 15B:
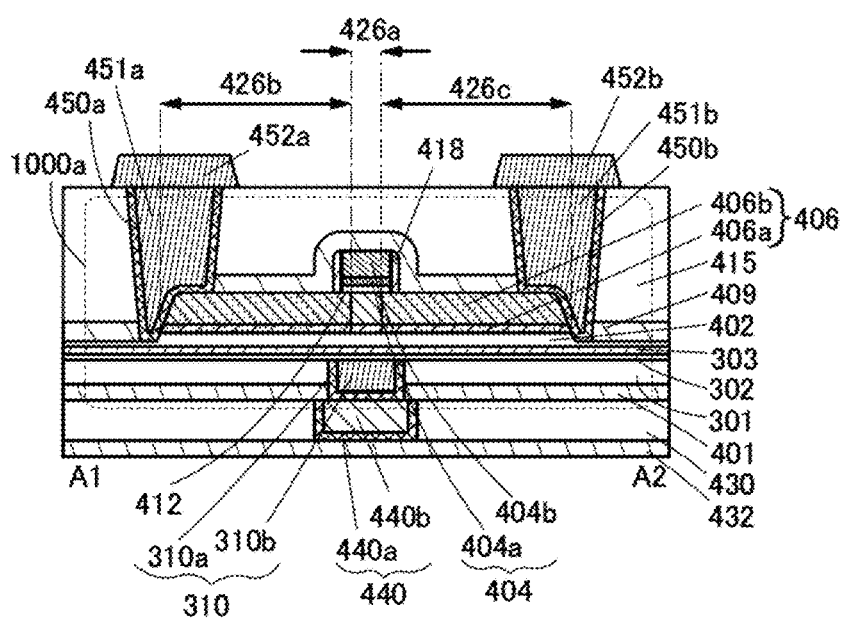

First, a transistor 1000a illustrated in FIGS. 15A to 15C will be described. FIG. 15A is a top view of the transistor 1000a. FIG. 15B is a cross-sectional view taken along the dashed-dotted line A1-A2 in FIG. 15A, which corresponds to a cross-sectional view in the channel length direction of the transistor 1000a. FIG. 15C is a cross-sectional view taken along the dashed-dotted line A3-A4 in FIG. 15A, which corresponds to a cross-sectional view in the channel width direction of the transistor 1000a. For simplification of the drawing, some components in the top view in FIG. 15A are not illustrated. Similarly, FIGS. 16A to 16C and FIGS. 17A to 17C also include top views and cross-sectional views.

The transistor 1000a is different from the transistor 1000 in that the insulator 419 is not provided over the conductor 404b. The description on the transistor 1000 can be referred to for the other components of the transistor 1000a.

In the case where the transistor 1000a is fabricated, the deposition of the insulating film 419A is not performed and the following steps are carried out after the step of depositing the conductive film 404bA illustrated in FIGS. 6A to 6C.

Next, a transistor 1000b illustrated in FIGS. 16A to 16C will be described. The transistor 1000b is different from the transistor 1000 in that the length of the conductor 310 in the channel width direction (A3-A4 direction) is shorter than that of the transistor 1000. The description on the transistor 1000 can be referred to for the other components of the transistor 1000b.

Figure 16A:
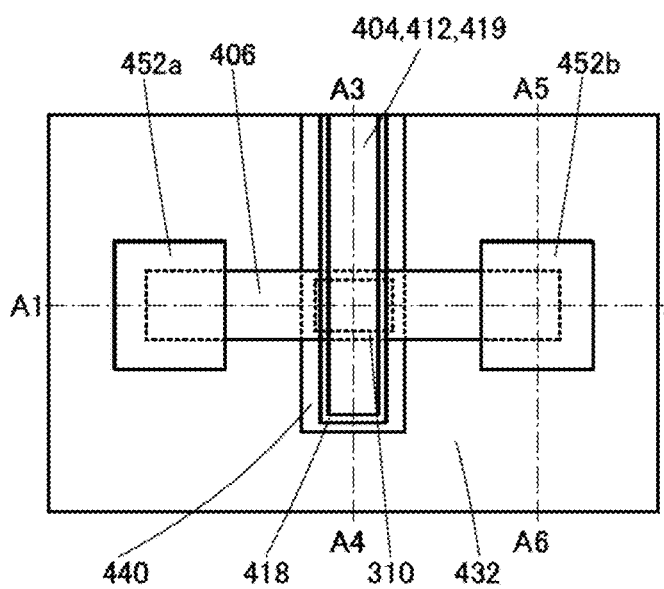
FIGS. 16A to 16C are a top view and cross-sectional views of a semiconductor device of one embodiment of the present invention.
Figure 16C:
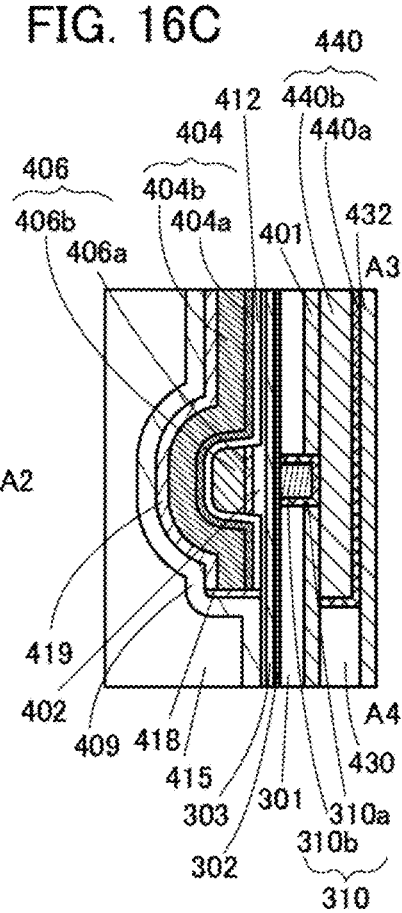
Figure 16B:
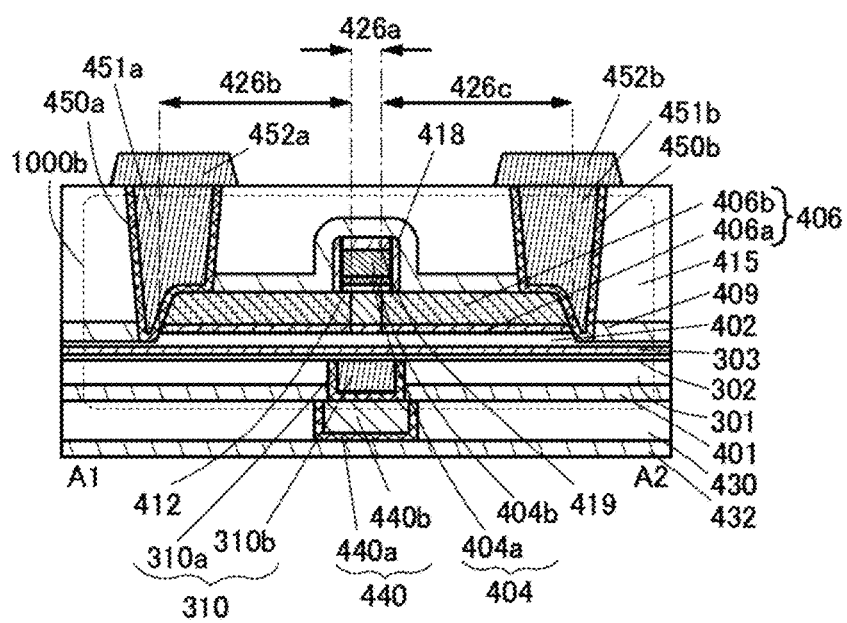

As illustrated in FIGS. 16A and 16C, the length of the conductor 310 in the channel width direction is preferably shorter than the length of the oxide 406 in the channel width direction. Furthermore, the side surface of the conductor 310 in the channel width direction is preferably more on the inside than the side surface of the oxide 406 in the channel width direction.

With such a structure, the distance between the conductor 310 and the conductor 404 in the channel width direction is increased, whereby the parasitic capacitance generated between the conductor 310 and the conductor 404 can be reduced. The reduction in parasitic capacitance can improve the operation speed of the transistor 1000b. Moreover, the increase in the distance between the conductor 310 and the conductor 404 in the channel width direction increases the withstand voltage between the conductor 310 and the conductor 404, whereby the reliability of the transistor 1000b can be improved.

Next, a transistor 1000c illustrated in FIGS. 17A to 17C will be described. The transistor 1000c is different from the transistor 1000 in that the length of the conductor 310 in the channel length direction (A1-A2 direction) is shorter than that of the transistor 1000. The description on the transistor 1000 can be referred to for the other components of the transistor 1000c.

Figure 17A:
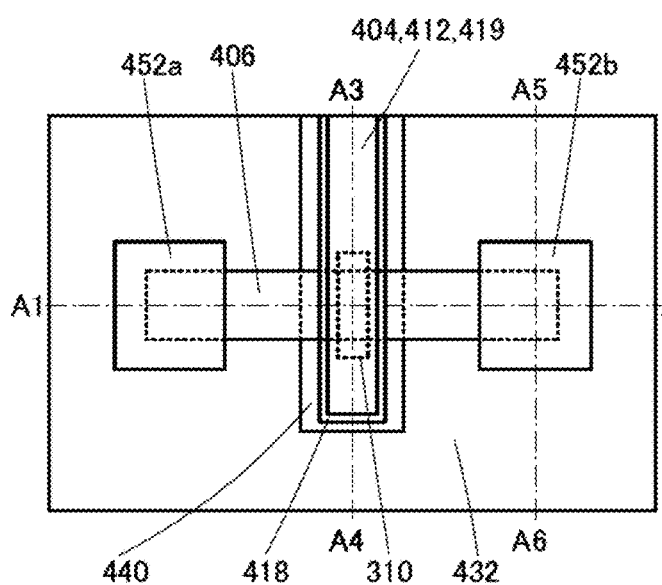
FIGS. 17A to 17C are a top view and cross-sectional views of a semiconductor device of one embodiment of the present invention.
Figure 17C:
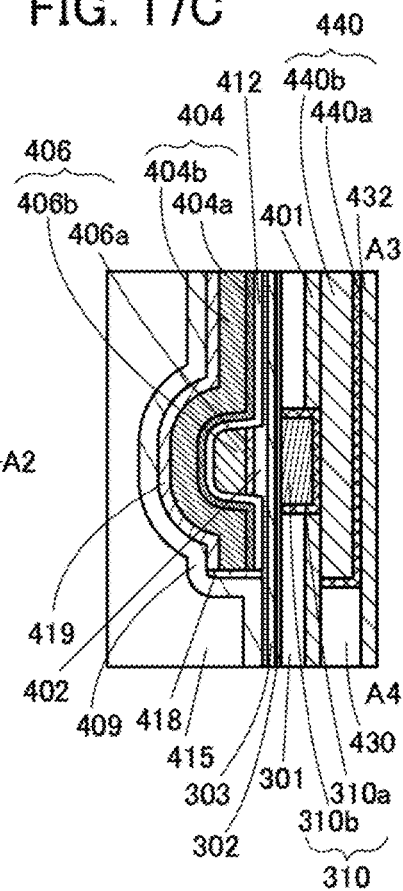
Figure 17B:
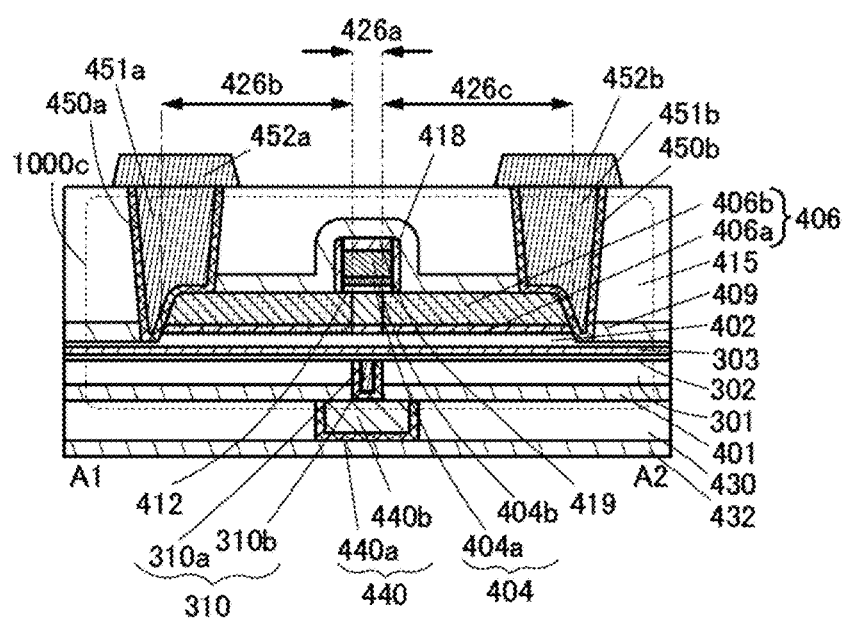

As illustrated in FIGS. 17A and 17B, the length of the conductor 310 in the channel length direction is preferably shorter than the length of the conductor 404 in the channel length direction. Furthermore, the side surface of the conductor 310 in the channel length direction is preferably more on the inside than the side surface of the conductor 404 in the channel length direction.

With such a structure, the distance between the conductor 310 and the conductor 404 in the channel length direction is increased, whereby the parasitic capacitance generated between the conductor 310 and the conductor 404 can be reduced. The reduction in parasitic capacitance can improve the operation speed of the transistor 1000c. Moreover, the increase in the distance between the conductor 310 and the conductor 404 in the channel length direction increases the withstand voltage between the conductor 310 and the conductor 404, whereby the reliability of the transistor 1000c can be improved.

As described above, according to one embodiment of the present invention, a semiconductor device that can be miniaturized or highly integrated, a semiconductor device having good electrical characteristics, a semiconductor device with low off-state current, a transistor with high on-state current, a highly reliable semiconductor device, a semiconductor device with low power consumption, or a semiconductor device that can be manufactured with high productivity can be provided.

The structures, methods, and the like described in this embodiment can be combined as appropriate with any of the structures, methods, and the like described in the other embodiments.

Embodiment 2

In this embodiment, one embodiment of a semiconductor device will be described with reference to FIGS. 19 to 22.

Memory Device

Figure 19:
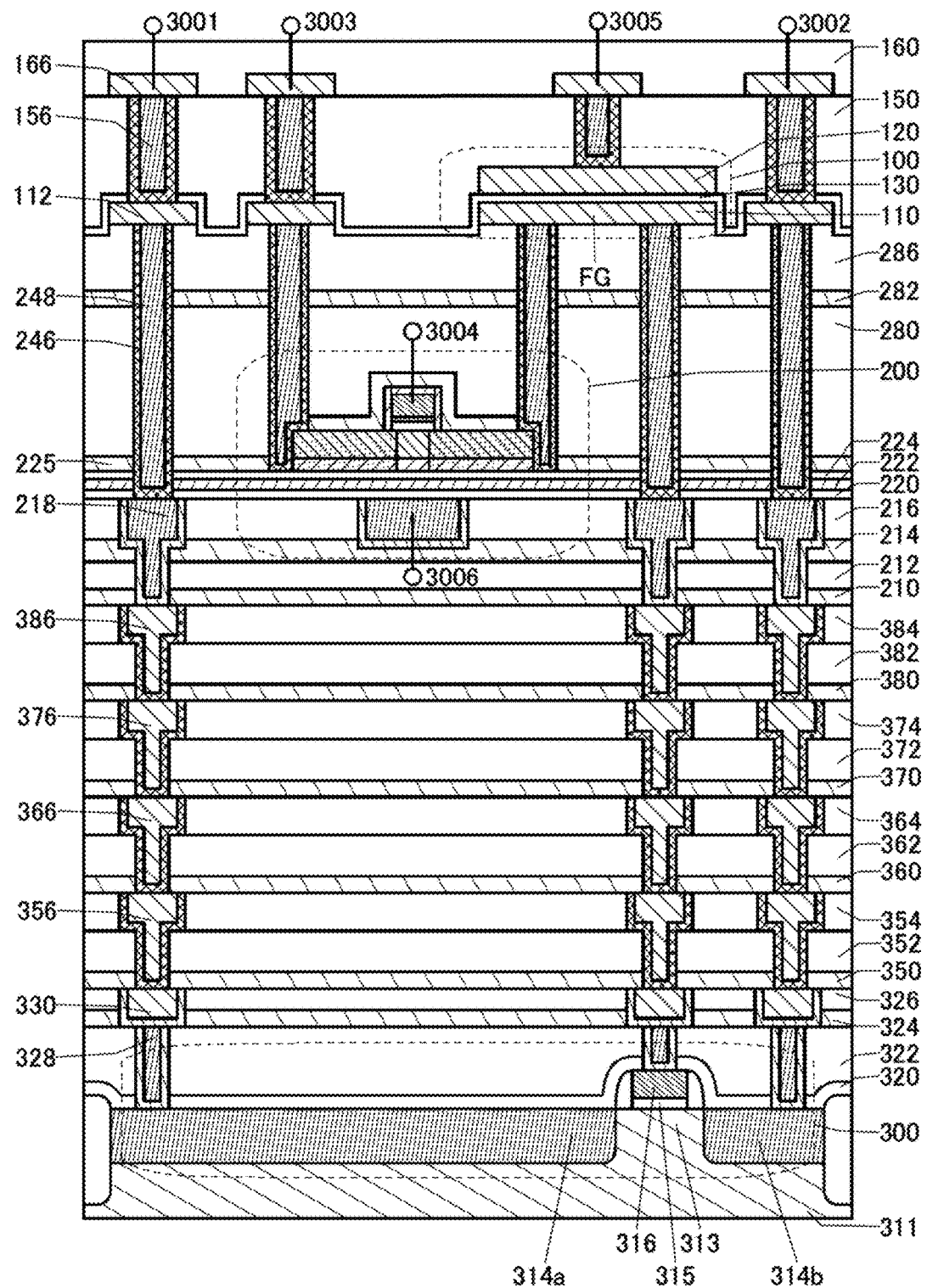
FIG. 19 is a cross-sectional view illustrating a structure of a memory device of one embodiment of the present invention.
Figure 20:
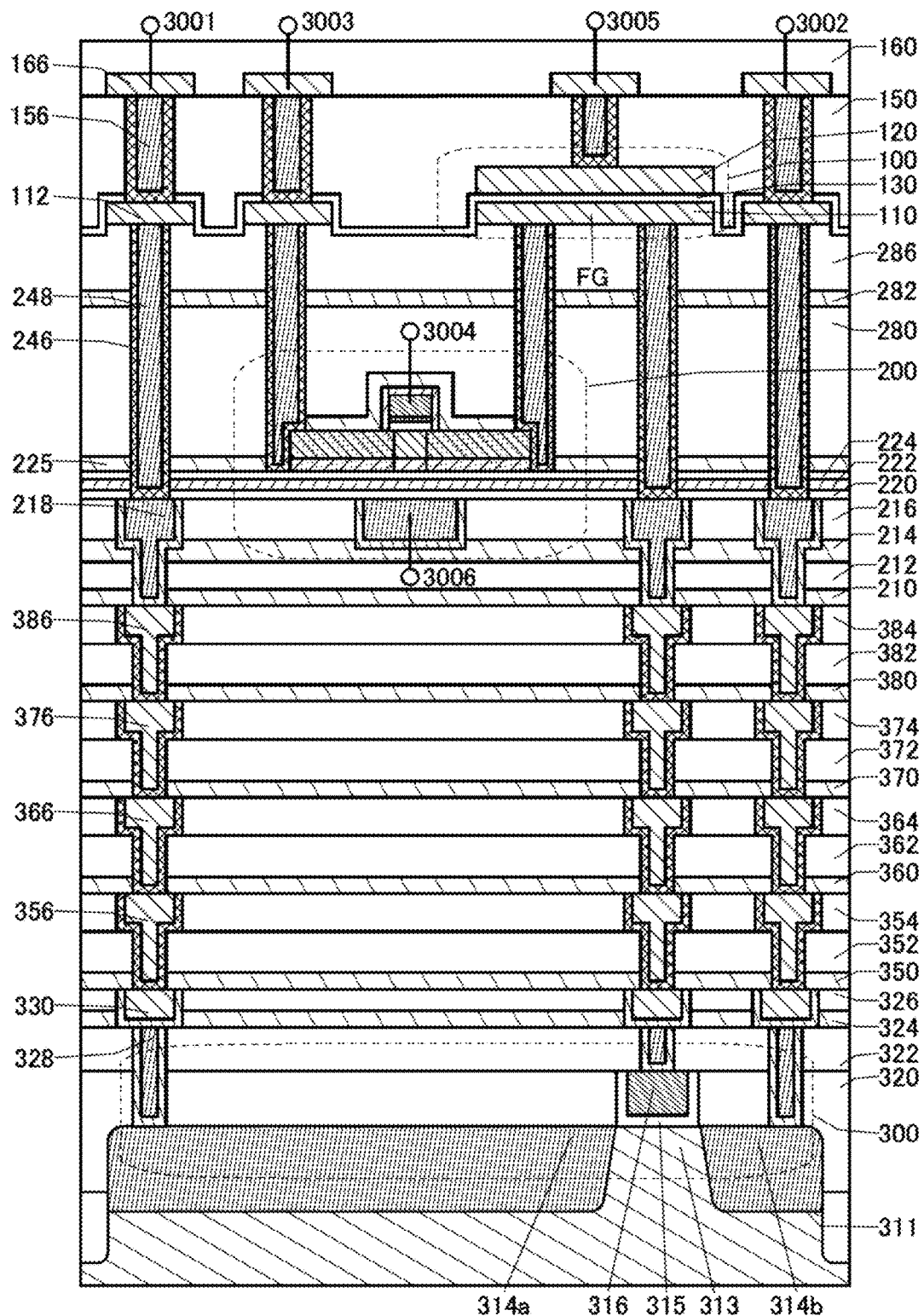
FIG. 20 is a cross-sectional view illustrating a structure of a memory device of one embodiment of the present invention.

Semiconductor devices illustrated in FIG. 19 and FIG. 20 each include a transistor 300, a transistor 200, and a capacitor 100.

The transistor 200 is a transistor in which a channel is formed in a semiconductor layer containing an oxide semiconductor, and can be the transistor described in Embodiment 1. Since the transistor described in Embodiment 1 can be formed with high yield even when it is miniaturized, the transistor 200 can be miniaturized. The use of such a transistor in a memory device allows miniaturization or high integration of the memory device. Since the off-state current of the transistor described in Embodiment 1 is low, a memory device including the transistor can retain stored data for a long time. In other words, such a memory device does not require refresh operation or has an extremely low frequency of the refresh operation, which leads to a sufficient reduction in power consumption of the memory device.

In each of FIG. 19 and FIG. 20, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a first gate of the transistor 200. A wiring 3006 is electrically connected to a second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor devices illustrated in FIG. 19 and FIG. 20 each have a feature that the potential of the gate of the transistor 300 can be retained and thus enable writing, retaining, and reading of data as follows.

Writing and retaining of data are described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained in the node FG (retaining).

In the case where the off-state current of the transistor 200 is low, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when a high-level charge is given to the gate of the transistor 300 is lower than an apparent threshold voltage $V_{th\_L}$ at the time when a low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between $V_{th\_H}$ and $V_{th\_L}$, whereby the charge supplied to the node FG can be determined. For example, in the case where a high-level charge is supplied to the node FG in writing and the potential of the wiring 3005 is $V_0$ ($>V_{th\_H}$), the transistor 300 is turned on. Meanwhile, in the case where a low-level charge is supplied to the node FG in writing, even when the potential of the wiring 3005 is $V_0$ ($<V_{th\_L}$), the transistor 300 remains off. Thus, the data retained in the node FG can be read by determining the potential of the wiring 3002.

Structure of Semiconductor Device 1

The semiconductor device of one embodiment of the present invention includes the transistor 300, the transistor 200, and the capacitor 100 as illustrated in FIG. 19. The transistor 200 is provided above the transistor 300, and the capacitor 100 is provided above the transistor 300 and the transistor 200.

The transistor 300 is provided over a substrate 311 and includes a conductor 316, an insulator 315, a semiconductor region 313 that is a part of the substrate 311, and a low-resistance region 314a and a low-resistance region 314b functioning as a source region and a drain region.

The transistor 300 may be a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like for the conductor. Furthermore, in order to ensure the conductivity and embeddability, it is preferable to use a stacked layer of metal materials such as tungsten and aluminum for the conductor. It is particularly preferable to use tungsten in terms of heat resistance.

Note that the transistor 300 illustrated in FIG. 19 is only an example and is not limited to have the structure illustrated in FIG. 19; a transistor appropriate for a circuit configuration or a driving method can be used.

An insulator 320, an insulator 322, an insulator 324, and an insulator 326 are stacked sequentially so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from the substrate 311, the transistor 300, or the like from diffusing to a region where the transistor 200 is formed.

As an example of the film having a barrier property against hydrogen, a silicon nitride film formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in the TDS analysis in the range from 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less that of the insulator 324, further preferably 0.6 times or less that of the insulator 324. In the case where a material with a low permittivity is used for an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor serves as a wiring and part of a conductor serves as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 19, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those used for forming the conductor 328 and the conductor 330.

Note that the insulator 350 is preferably formed using an insulator having a barrier property against hydrogen, as with the insulator 324, for example. Furthermore, the conductor 356 preferably contains a conductor having a barrier property against hydrogen. In particular, the conductor having a barrier property against hydrogen is formed in an opening of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 19, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to those used for forming the conductor 328 and the conductor 330.

Note that the insulator 360 is preferably formed using an insulator having a barrier property against hydrogen, as with the insulator 324, for example. Furthermore, the conductor 366 preferably contains a conductor having a barrier property against hydrogen. In particular, the conductor having a barrier property against hydrogen is formed in an opening of the insulator 360 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 364 and the conductor 366. For example, in FIG. 19, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be formed using a material similar to those used for forming the conductor 328 and the conductor 330.

Note that the insulator 370 is preferably formed using an insulator having a barrier property against hydrogen, as with the insulator 324, for example. Furthermore, the conductor 376 preferably contains a conductor having a barrier property against hydrogen. In particular, the conductor having a barrier property against hydrogen is formed in an opening of the insulator 370 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 374 and the conductor 376. For example, in FIG. 19, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be formed using a material similar to those used for forming the conductor 328 and the conductor 330.

Note that the insulator 380 is preferably formed using an insulator having a barrier property against hydrogen, as with the insulator 324, for example. Furthermore, the conductor 386 preferably contains a conductor having a barrier property against hydrogen. In particular, the conductor having a barrier property against hydrogen is formed in an opening of the insulator 380 having a barrier property against hydrogen. In such a structure, the transistor 300 and the transistor 200 can be separated by a barrier layer, so that the diffusion of hydrogen from the transistor 300 to the transistor 200 can be prevented.

An insulator 210, an insulator 212, an insulator 214, and an insulator 216 are stacked sequentially over the insulator 384. A material having a barrier property against oxygen or hydrogen is preferably used for any of the insulator 210, the insulator 212, the insulator 214, and the insulator 216.

Each of the insulators 210 and 214 is preferably formed using, for example, a film having a barrier property that prevents hydrogen or impurities from the substrate 311, a region where the transistor 300 is formed, or the like from diffusing to a region where the transistor 200 is formed. Thus, each of the insulators 210 and 214 can be formed using a material similar to that used for forming the insulator 324.

As an example of the film having a barrier property against hydrogen, a silicon nitride film formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which hydrogen is less likely to be released.

For the film having a barrier property against hydrogen used for each of the insulators 210 and 214, for example, a metal oxide such as aluminum oxide, hafnium oxide, or tantalum oxide is preferably used.

In particular, aluminum oxide has an excellent blocking effect that prevents permeation of oxygen and impurities such as water or hydrogen which cause a change in electrical characteristics of the transistor. Accordingly, the use of aluminum oxide can prevent the entry of impurities such as water or hydrogen into the transistor 200 in and after a manufacturing process of the transistor. In addition, release of oxygen from the oxide contained in the transistor 200 can be prevented. Therefore, aluminum oxide is suitably used for a protective film of the transistor 200.

The insulators 212 and 216 can be formed using a material similar to that used for forming the insulator 320, for example. Interlayer films formed of a material with a relatively low permittivity can reduce the parasitic capacitance between wirings. For example, a silicon oxide film, a silicon oxynitride film, or the like can be used for the insulators 212 and 216.

A conductor 218, a conductor (e.g., an electrode serving as a back gate) included in the transistor 200, and the like are provided in the insulators 210, 212, 214, and 216. Note that the conductor 218 functions as a plug or a wiring that is electrically connected to the capacitor 100 or the transistor 300. The conductor 218 can be formed using a material similar to those used for forming the conductors 328 and 330.

Note that the electrode serving as the back gate of the transistor 200 and a wiring to supply a potential to the electrode may be formed in the same tier, as illustrated in FIG. 19. Alternatively, as described in the above embodiment, the wiring to supply a potential to the electrode may be formed in a tier under the electrode serving as the back gate of the transistor 200 to constitute a stack. In that case, the insulator 214, the insulator 216, and the like are formed to have stacked-layer structures appropriately in accordance with the structure described in the above embodiment.

In particular, part of the conductor 218 that is in contact with the insulators 210 and 214 is preferably a conductor having a barrier property against oxygen, hydrogen, and water. In such a structure, the transistors 300 and 200 can be completely separated by the layer having a barrier property against oxygen, hydrogen, and water. As a result, the diffusion of hydrogen from the transistor 300 to the transistor 200 can be prevented.

The transistor 200 is provided over the insulator 216. Note that any of the transistors included in the semiconductor devices described in the above embodiment can be used as the transistor 200. As the transistor 200, for example, the transistor 1000, the transistor 1000a, the transistor 1000b, the transistor 1000c, or the like can be used. FIG. 19 illustrates an example where the transistor 1000 is used as the transistor 200. Note that the transistor 200 in FIG. 19 is only an example and is not limited to have the structure illustrated in FIG. 19; a transistor appropriate for a circuit configuration or a driving method can be used.

An insulator 280 is provided over the transistor 200. In the insulator 280, an excess-oxygen region is preferably formed. In particular, in the case where an oxide semiconductor is used in the transistor 200 and an insulator having an excess-oxygen region is provided in an interlayer film or the like in the vicinity of the transistor 200, oxygen vacancies in the oxide 406 included in the transistor 200 are reduced, whereby the reliability can be improved. The insulator 280 that covers the transistor 200 may function as a planarization film that covers a roughness thereunder. Note that the insulator 280 is provided to be in contact with an insulator 225 that is formed over the transistor 200.

For the insulator having an excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

As such a material, a material containing silicon oxide or silicon oxynitride is preferably used, for example. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

An insulator 282 may be provided over the insulator 280. A material having a barrier property against oxygen or hydrogen is preferably used for the insulator 282. Thus, the insulator 282 can be formed using a material similar to that used for forming the insulator 214. For the insulator 282, a metal oxide such as aluminum oxide, hafnium oxide, or tantalum oxide is preferably used, for example. When the insulator 282 is deposited by a sputtering method with the use of plasma that contains oxygen, oxygen can be added to the insulator 280 which serves as a base layer of the oxide.

In particular, aluminum oxide has an excellent blocking effect that prevents permeation of oxygen and impurities such as water or hydrogen which cause a change in electrical characteristics of the transistor. Accordingly, the use of aluminum oxide can prevent the entry of impurities such as water or hydrogen into the transistor 200 in and after a manufacturing process of the transistor. In addition, release of oxygen from the oxide contained in the transistor 200 can be prevented. Therefore, aluminum oxide is suitably used for a protective film of the transistor 200.

In the case where the transistor 1000 is provided as the transistor 200, the insulator 214 corresponds to the insulator 401 or the insulator 432, the conductor 218 corresponds to the conductor 310 or the conductor 440, the insulator 216 corresponds to the insulator 430 or the insulator 301, an insulator 220 corresponds to the insulator 302, an insulator 222 corresponds to the insulator 303, an insulator 224 corresponds to the insulator 402, the insulator 225 corresponds to the insulator 409, and the insulator 280 corresponds to the insulator 415. Thus, the description of the corresponding components in Embodiment 1 can be referred to.

An insulator 286 is provided over the insulator 282. The insulator 286 can be formed using a material similar to that used for forming the insulator 320. An interlayer film formed of a material with a relatively low permittivity can reduce the parasitic capacitance between wirings. For example, a silicon oxide film, a silicon oxynitride film, or the like can be used for the insulator 286.

A conductor 246, a conductor 248, and the like are provided in the insulators 220, 222, 224, 280, 282, and 286.

The conductors 246 and 248 function as plugs or wirings that are electrically connected to the capacitor 100, the transistor 200, or the transistor 300. The conductors 246 and 248 can be formed using a material similar to those used for forming the conductors 328 and 330.

The capacitor 100 is provided above the transistor 200. The capacitor 100 includes a conductor 110, a conductor 120, and an insulator 130.

A conductor 112 may be provided over the conductors 246 and 248. The conductor 112 functions as a plug or a wiring that is electrically connected to the capacitor 100, the transistor 200, or the transistor 300. The conductor 110 functions as the electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added.

The conductor 112 and the conductor 110 each have a single-layer structure in FIG. 19; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

A material with high dielectric strength, such as silicon oxynitride, is preferably used for the insulator 130, for example. In the capacitor 100 having such a structure, the dielectric strength can be increased and the electrostatic breakdown of the capacitor 100 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu, Al, or the like which is a low-resistance metal material can be used.

An insulator 150 is provided over the conductor 120 and the insulator 130. The insulator 150 can be formed using a material similar to that used for forming the insulator 320. The insulator 150 may function as a planarization film that covers a roughness thereunder.

The above is the description of the structure example. With the use of this structure, in a semiconductor device including a transistor containing an oxide semiconductor, a change in electrical characteristics can be inhibited and reliability can be improved, power consumption can be reduced, or miniaturization or high integration of the semiconductor device can be achieved. Alternatively, a miniaturized or highly integrated semiconductor device can be provided with high productivity.

Modification Example 1 of Memory Device

A modification example of this embodiment is illustrated in FIG. 20. FIG. 20 is different from FIG. 19 in the structure of the transistor 300.

In the transistor 300 illustrated in FIG. 20, the semiconductor region 313 (part of the substrate 311) in which a channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator functioning as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

The above is the description of the modification example. With the use of this structure, in a semiconductor device including a transistor containing an oxide semiconductor, a change in electrical characteristics can be inhibited and reliability can be improved, power consumption can be reduced, or miniaturization or high integration of the semiconductor device can be achieved. Alternatively, a miniaturized or highly integrated semiconductor device can be provided with high productivity.

Modification Example 2 of Memory Device

Figure 21:
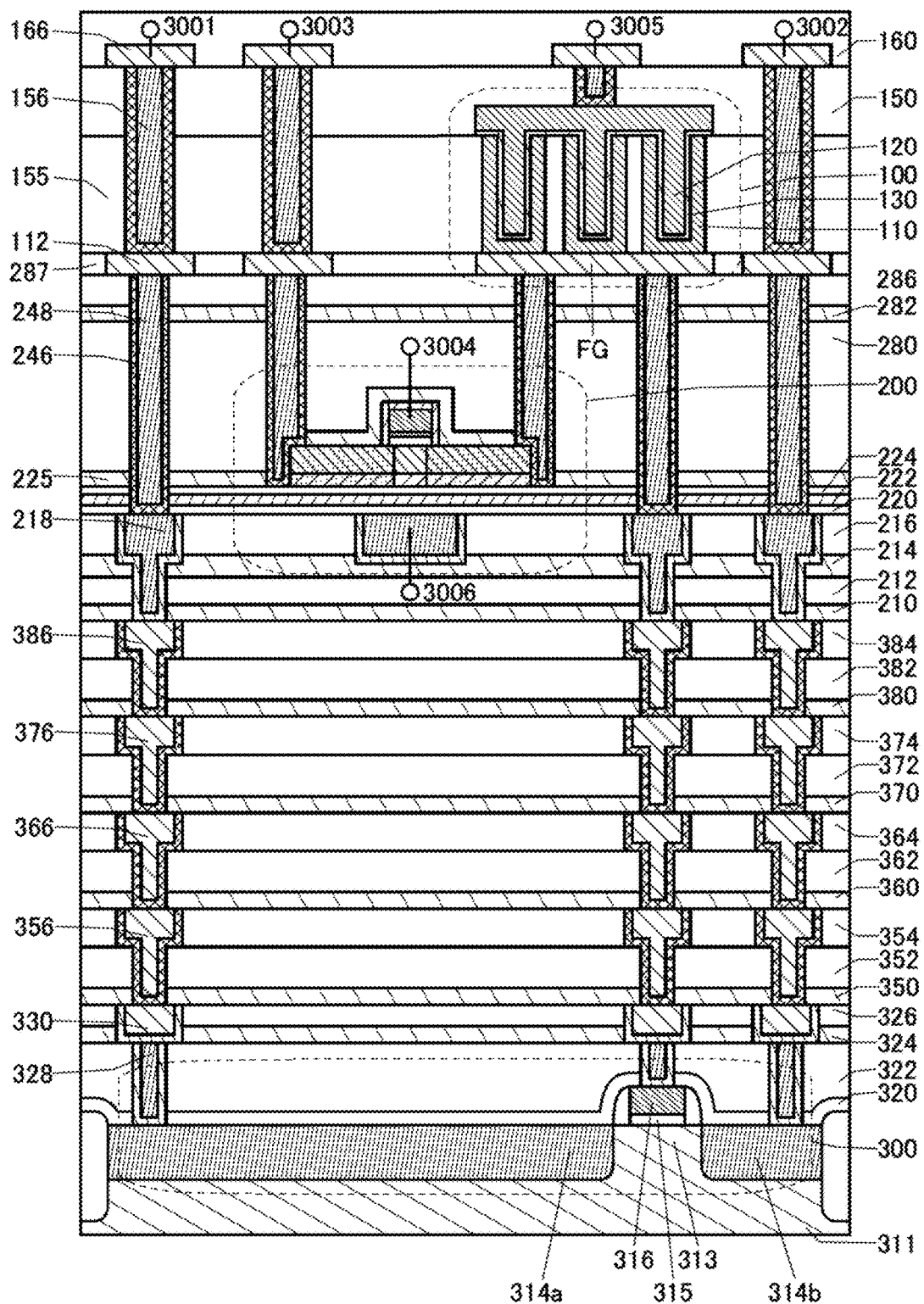
FIG. 21 is a cross-sectional view illustrating a structure of a memory device of one embodiment of the present invention.

Another modification example of this embodiment is illustrated in FIG. 21. FIG. 21 is different from FIG. 19 in the structure of the capacitor 100.

In a memory device illustrated in FIG. 21, an insulator 287 is provided over the insulator 286, the conductor 112 is embedded in the insulator 287, an insulator 155 is provided over the insulator 287, the conductors 110 are provided in a plurality of openings formed in the insulator 155, the insulator 130 is provided over the conductors 110, and the conductor 120 is provided over the insulator 130 so as to overlap with the conductors 110. The conductor 112 is provided to connect the conductor 248 electrically connected to the transistor 200 and the conductor 248 electrically connected to the transistor 300, and the conductors 110 are provided in contact with the conductor 112. The insulator 287 and the insulator 155 can be formed using a material similar to that of the insulator 320.

In the capacitor 100 illustrated in FIG. 21, the conductors 110, the insulator 130, and the conductor 120 overlap with each other in the openings formed in the insulator 155; thus, the conductors 110, the insulator 130, and the conductor 120 preferably have favorable coverage. For this reason, the conductors 110, the insulator 130, and the conductor 120 are preferably deposited by a method with which a film having favorable step coverage can be formed, such as a CVD method or an ALD method.

Because the capacitor 100 is formed along the shapes of the openings formed in the insulator 155, the capacitance can be larger as the openings become deeper. Furthermore, the capacitance can be larger as the number of the openings becomes larger. With the capacitor 100 having such a structure, the capacitance can be increased without increasing the area of the top surface of the capacitor 100.

The above is the description of the modification example. With the use of this structure, in a semiconductor device including a transistor containing an oxide semiconductor, a change in electrical characteristics can be inhibited and reliability can be improved, power consumption can be reduced, or miniaturization or high integration of the semiconductor device can be achieved. Alternatively, a miniaturized or highly integrated semiconductor device can be provided with high productivity.

Structure of Memory Cell Array

Figure 22:
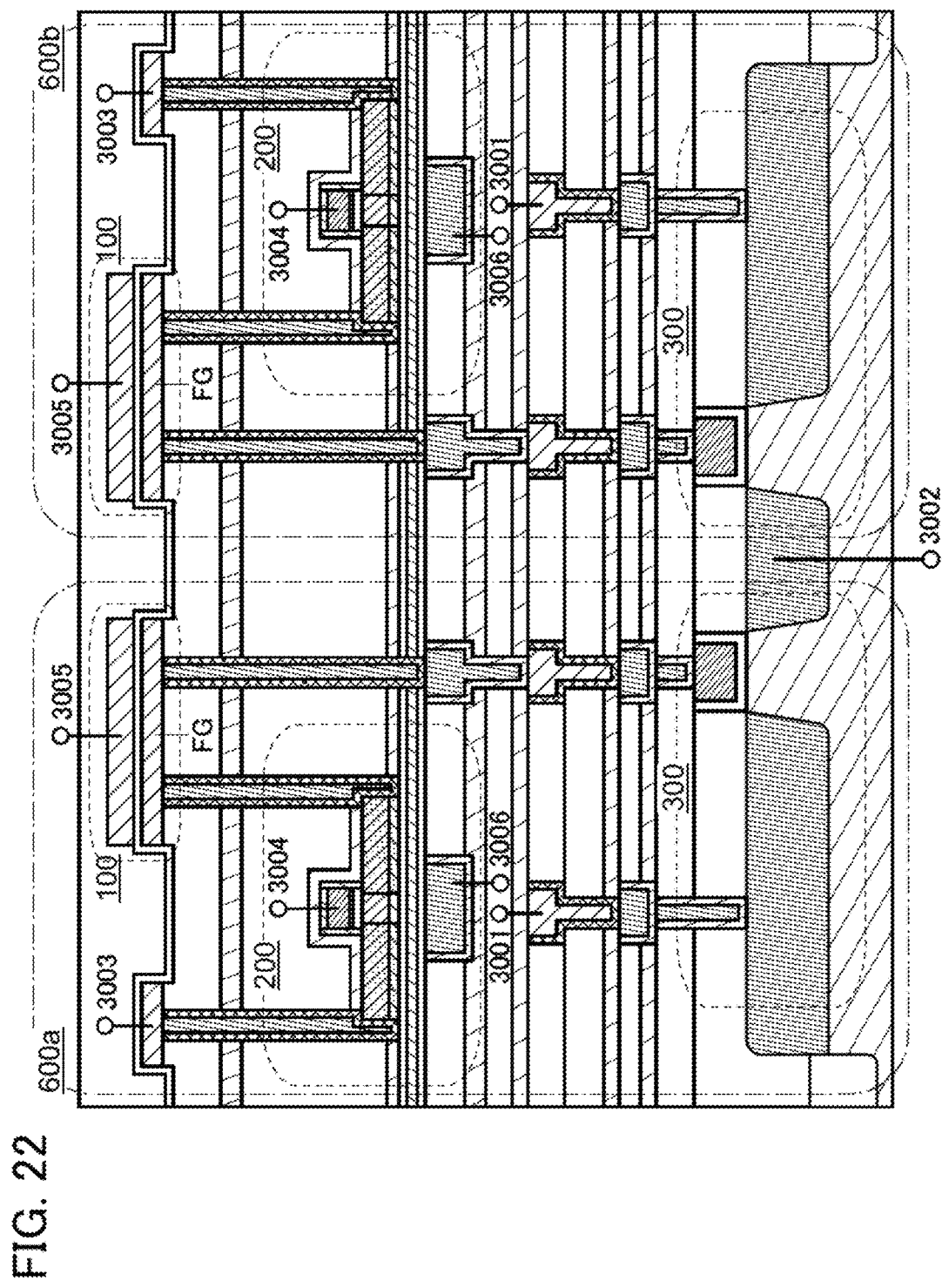
FIG. 22 is a cross-sectional view illustrating a structure of a memory device of one embodiment of the present invention.

FIG. 22 illustrates an example of a memory cell array of this embodiment. When the memory devices each of which is illustrated in FIG. 19 or FIG. 20 are arranged as memory cells in a matrix, a memory cell array can be formed. FIG. 22 is a cross-sectional view that illustrates part of a row in which the memory devices each of which is illustrated in FIG. 19 are arranged in a matrix.

In a memory device illustrated in FIG. 22, a memory cell 600a and a memory cell 600b are arranged adjacent to each other. As in the memory device illustrated in FIG. 19, the transistors 300 and 200 and the capacitor 100 are included and electrically connected to the wirings 3001, 3002, 3003, 3004, 3005, and 3006 in each of the memory cells 600a and 600b. Also in the memory cells 600a and 600b, a node where a gate of the transistor 300 and one electrode of the capacitor 100 are electrically connected to each other is referred to as the node FG. Note that the wiring 3002 is shared by the memory cells 600a and 600b adjacent to each other.

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$, is supplied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$, is supplied to the wiring 3005 connected to the memory cells from which data is not read.

The above is the description of the structure examples. With the use of any of the structures, in a semiconductor device including a transistor containing an oxide semiconductor, a change in electrical characteristics can be prevented and reliability can be improved, power consumption can be reduced, or miniaturization or high integration of the semiconductor device can be achieved. Alternatively, a miniaturized or highly integrated semiconductor device can be provided with high productivity.

As described above, the structures, methods, and the like described in this embodiment can be combined with any of the structures, methods, and the like described in the other embodiments as appropriate.

Embodiment 3

In this embodiment, one embodiment of a semiconductor device will be described with reference to FIGS. 23A and 23B and FIGS. 24A and 24B.

Semiconductor Wafer and Chip

Figure 23A:
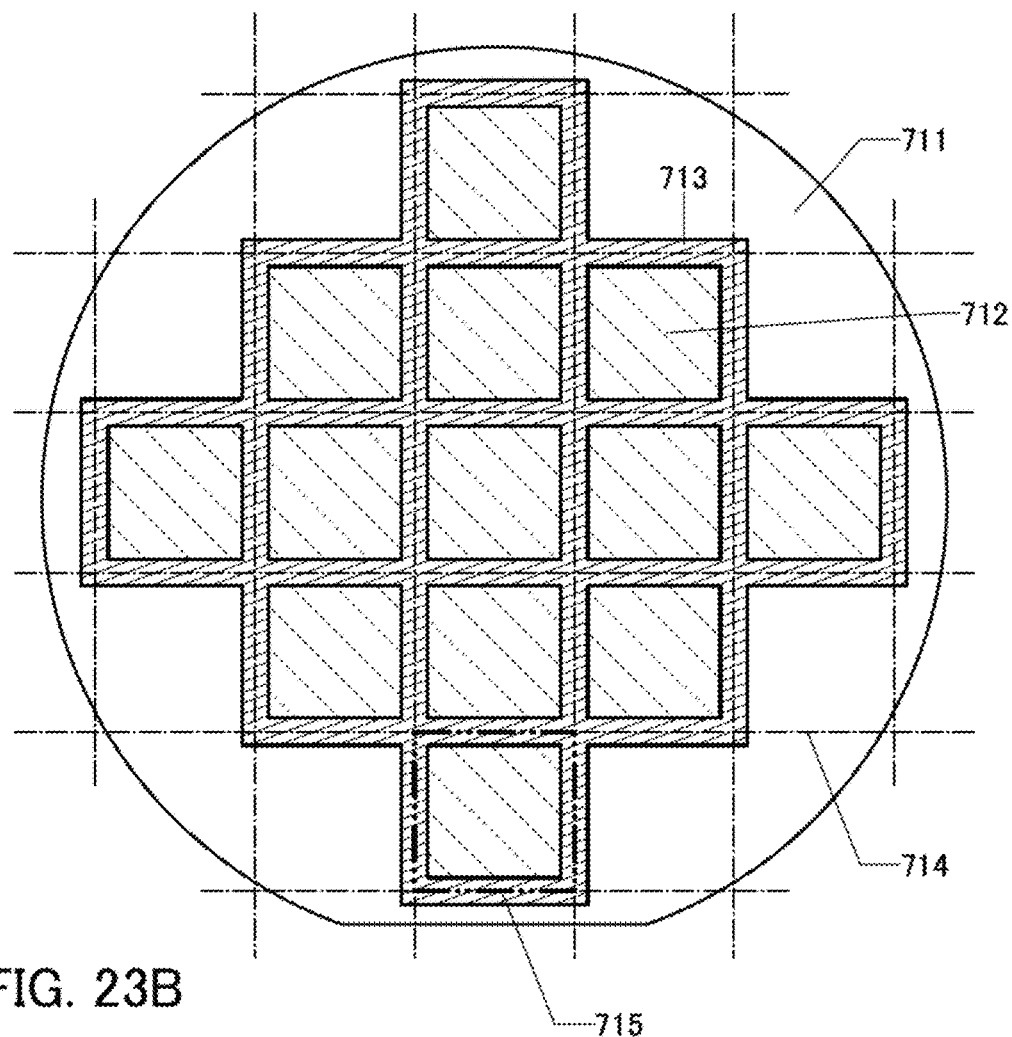
FIGS. 23A and 23B are top views of a semiconductor wafer of one embodiment of the present invention.

FIG. 23A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention or the like can be provided in the circuit region 712.

Figure 23B:
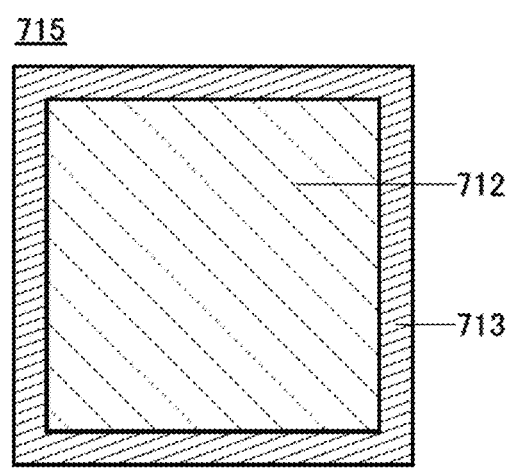

Each of the circuit regions 712 is surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 23B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down the substrate, remove swarf, and prevent electrification, for example. Providing a conductive layer, a semiconductor layer, or the like in the separation regions 713 allows a reduction in the usage of the pure water. Thus, the cost of manufacturing semiconductor devices can be reduced. In addition, semiconductor devices can be manufactured with improved productivity.

Electronic Component

Figure 24A:
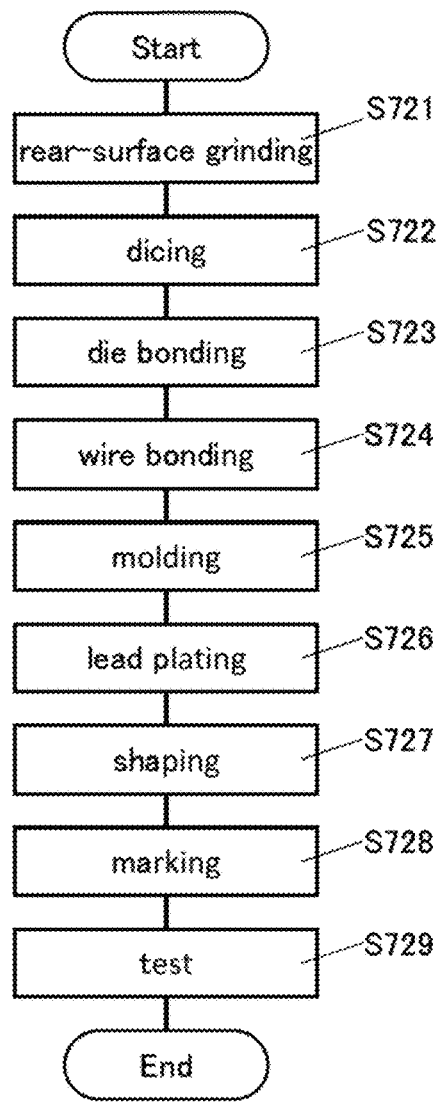
FIG. 24A is a flowchart showing a manufacturing process example of an electronic component.

An example of an electronic component using the chip 715 will be described with reference to FIGS. 24A and 24B. Note that an electronic component is also referred to as a semiconductor package or an IC package. For electronic components, there are various standards, names, and the like in accordance with the direction in which terminals are extracted, the shapes of terminals, and the like.

The electronic component is completed when the semiconductor device described in any of the above embodiments is combined with components other than the semiconductor device in an assembly process (post-process).

The post-process is described with reference to a flow chart in FIG. 24A. After the semiconductor device of one embodiment of the present invention and the like are formed over the substrate 711 in a pre-process, a back surface grinding step in which the back surface (the surface where a semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). Through the plating process, corrosion of the lead can be prevented, and soldering for mounting the electronic component on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 24B:
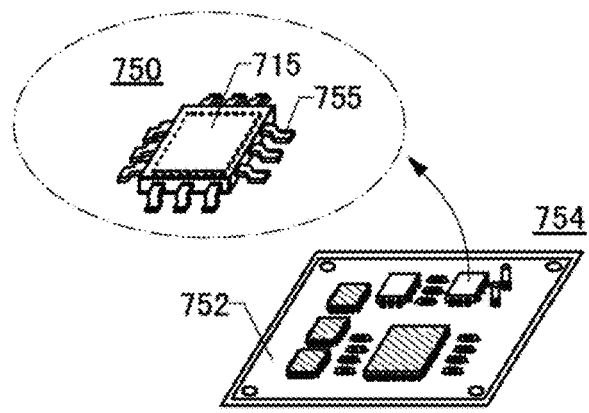
FIG. 24B is a schematic perspective view of the electronic component.

FIG. 24B is a perspective schematic diagram of a completed electronic component. FIG. 24B shows a perspective schematic diagram of a quad flat package (QFP) as an example of an electronic component. An electronic component 750 in FIG. 24B includes a lead 755 and the chip 715. The electronic component 750 may include multiple chips 715.

The electronic component 750 in FIG. 24B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Embodiment 4

Electronic Device

A semiconductor device of one embodiment of the present invention can be used for a variety of electronic devices. FIGS. 25A to 25F each illustrate a specific example of an electronic device including the semiconductor device of one embodiment of the present invention.

Figure 25A:
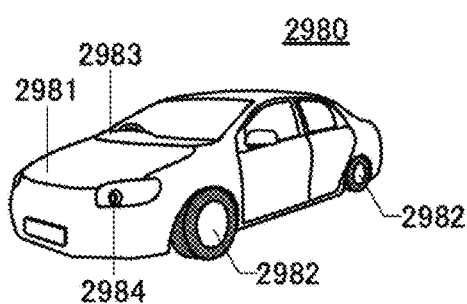
FIGS. 25A to 25F each illustrate an electronic device of one embodiment of the present invention.

FIG. 25A is an external view illustrating an example of a car. A car 2980 includes a car body 2981, wheels 2982, a dashboard 2983, lights 2984, and the like. The car 2980 also includes an antenna, a battery, and the like.

Figure 25B:
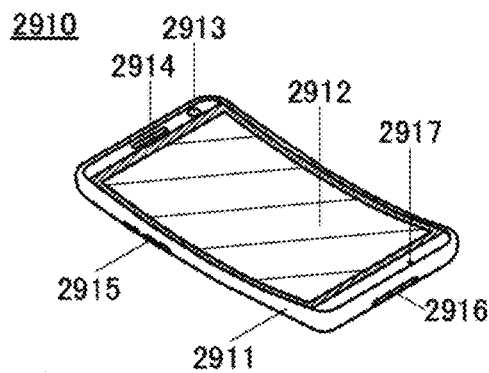

An information terminal 2910 illustrated in FIG. 25B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 25C:
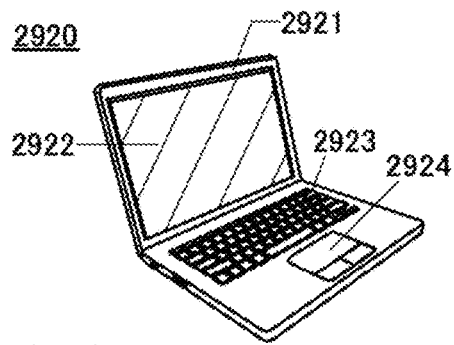

A notebook personal computer 2920 illustrated in FIG. 25C includes a housing 2921, a display portion 2922, a keyboard 2923, a pointing device 2924, and the like. The notebook personal computer 2920 also includes an antenna, a battery, and the like inside the housing 2921.

Figure 25D:
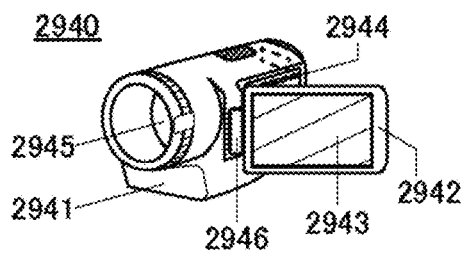

A video camera 2940 illustrated in FIG. 25D includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. By changing the angle between the housings 2941 and 2942, the orientation of an image displayed on the display portion 2943 may be changed or display and non-display of an image may be switched.

Figure 25E:
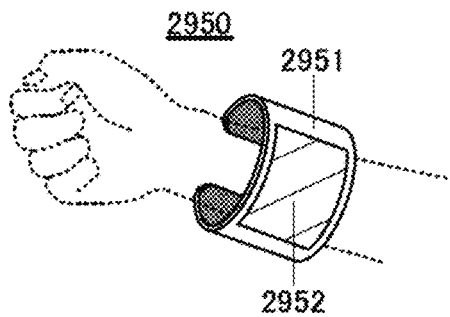

FIG. 25E illustrates an example of a bangle-type information terminal. An information terminal 2950 includes a housing 2951, a display portion 2952, and the like. The information terminal 2950 also includes an antenna, a battery, and the like inside the housing 2951. The display portion 2952 is supported by the housing 2951 having a curved surface. A display panel with a flexible substrate is provided in the display portion 2952, so that the information terminal 2950 can be a user-friendly information terminal that is flexible and lightweight.

Figure 25F:
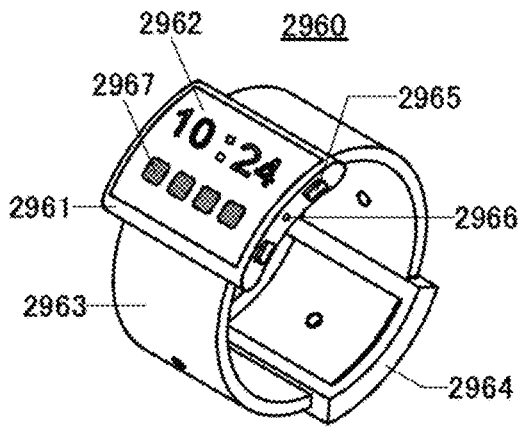

FIG. 25F illustrates an example of a watch-type information terminal. An information terminal 2960 includes a housing 2961, a display portion 2962, a band 2963, a buckle 2964, an operation switch 2965, an input/output terminal 2966, and the like. The information terminal 2960 also includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. The functions of the operation switch 2965 can be set by setting the operating system incorporated in the information terminal 2960, for example.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is also possible. The charging operation may be performed by wireless power feeding without using the input/output terminal 2966.

A memory device including the semiconductor device of one embodiment of the present invention, for example, can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments.

This application is based on Japanese Patent Application Serial No. 2016-214724 filed with Japan Patent Office on Nov. 1, 2016, the entire contents of which are hereby incorporated by reference.

What is claimed is:
1. A semiconductor device comprising:
a first insulator over a substrate;
a first oxide over the first insulator;
a second oxide in contact with at least a portion of a top surface of the first oxide;
a second insulator over the second oxide;
a first conductor over the second insulator;
a second conductor over the first conductor;
a third insulator over the second conductor;
a fourth insulator in contact with side surfaces of the second insulator, the first conductor, the second conductor, and the third insulator; and
a fifth insulator in contact with a top surface of the second oxide and a side surface of the fourth insulator,
wherein the third insulator comprises aluminum oxide or hafnium oxide,
wherein the fourth insulator comprises aluminum oxide or hafnium oxide,
wherein a thickness of the fourth insulator is greater than or equal to 1 nm and smaller than or equal to 20 nm, and
wherein a top surface of the fourth insulator is substantially aligned with a top surface of the third insulator.

2. The semiconductor device according to claim 1,
wherein the first oxide and the second oxide each comprise In, an element M, and Zn, and
wherein the element M is Al, Ga, Y, or Sn.

3. The semiconductor device according to claim 2,
wherein the first oxide comprises a first region not overlapping with the fourth insulator and the second conductor and a second region overlapping with the fourth insulator and the second conductor, and
wherein an atomic ratio of In to the element M is greater in the first region than in the second region.

4. The semiconductor device according to claim 1,
wherein the second oxide comprises at least a third region in contact with the fifth insulator and a fourth region overlapping with the second insulator, and
wherein a concentration of at least one of hydrogen and nitrogen is higher in the third region than in the fourth region.

5. The semiconductor device according to claim 4, wherein the third region comprises a portion overlapping with the fourth insulator and the second insulator.

6. The semiconductor device according to claim 1, wherein a thickness of the third insulator is greater than the thickness of the fourth insulator.

7. The semiconductor device according to claim 1, wherein the first conductor comprises a conductive oxide.

8. The semiconductor device according to claim 1, wherein the fifth insulator comprises either one or both of hydrogen and nitrogen.

9. The semiconductor device according to claim 1, wherein the fifth insulator is in contact with a side surface of the first oxide and a side surface of the second oxide.

10. The semiconductor device according to claim 1, further comprising:
a third conductor; and
a fourth conductor,
wherein the fourth conductor is placed to face the third conductor, with the first conductor and the second conductor positioned between the third conductor and the fourth conductor,
wherein the third conductor is in contact with the top surface and a first side surface of the second oxide through a first opening in the fifth insulator, and
wherein the fourth conductor is in contact with the top surface and a second side surface of the second oxide through a second opening in the fifth insulator.

11. The semiconductor device according to claim 10, further comprising a fifth conductor below the first insulator,
wherein the fifth conductor is placed to comprise a region overlapping with the second oxide, the first conductor, and the second conductor.

12. A semiconductor device comprising:
an oxide semiconductor layer;

a gate insulating film over the oxide semiconductor layer;
a gate electrode over the gate insulating film;
a first insulator over the gate electrode; and
a second insulator in contact with side surfaces of the gate insulating film, the gate electrode, and the first insulator,
wherein the first insulator comprises aluminum oxide or hafnium oxide,
wherein the second insulator comprises aluminum oxide or hafnium oxide, and
wherein a thickness of the second insulator is greater than or equal to 1 nm and smaller than or equal to 20 nm.

* * * * *